United States Patent
Umehara et al.

[11] Patent Number: 5,960,260
[45] Date of Patent: Sep. 28, 1999

[54] SEMICONDUCTOR DEVICE, ITS MANUFACTURING METHOD, AND DICING ADHESIVE ELEMENT THEREFOR

[75] Inventors: Norito Umehara, Oita; Masazumi Amagai, Beppu, both of Japan

[73] Assignee: Texas Instruments Incorporated, Dallas, Tex.

[21] Appl. No.: 08/835,333

[22] Filed: Apr. 7, 1997

Related U.S. Application Data

[62] Division of application No. 08/721,083, Sep. 26, 1996, abandoned.

[30] Foreign Application Priority Data

Sep. 29, 1995 [JP] Japan .................................. 7-276346

[51] Int. Cl.⁶ .......................... H01L 21/44; H01L 21/48; H01L 21/50
[52] U.S. Cl. ...................... 438/118; 438/464; 438/460; 438/928; 438/976
[58] Field of Search ................................ 438/464, 460, 438/118, 928, 976

[56] References Cited

U.S. PATENT DOCUMENTS

| | | | |
|---|---|---|---|
| 4,664,739 | 5/1987 | Aurichio | 156/344 |
| 4,793,883 | 12/1988 | Sheyon et al. | 156/235 |
| 5,194,934 | 3/1993 | Yamazaki et al. | 257/782 |
| 5,237,205 | 8/1993 | Newman | 257/783 |
| 5,444,301 | 8/1995 | Song et al. | 257/737 |
| 5,504,374 | 4/1996 | Oliver et al. | 257/746 |

*Primary Examiner*—John F. Niebling
*Assistant Examiner*—David A. Zarneke
*Attorney, Agent, or Firm*—William B. Kempler; Richard L. Donaldson

[57] ABSTRACT

Our semiconductor device is an IC chip 10 whose back surface is affixed to a mounting section 81 by means of a thermoplastic adhesive (for example, thermoplastic polyimide) 84. Package cracks are eliminated or markedly reduced and the problems with productivity for mounting curing and mounting alleviated. Even when a padless special lead frame or one with a small die pad is used, package cracks are eliminated or markedly reduced, and the lead frame can be mounted easily and with good reliability on top of the lead frame.

13 Claims, 23 Drawing Sheets

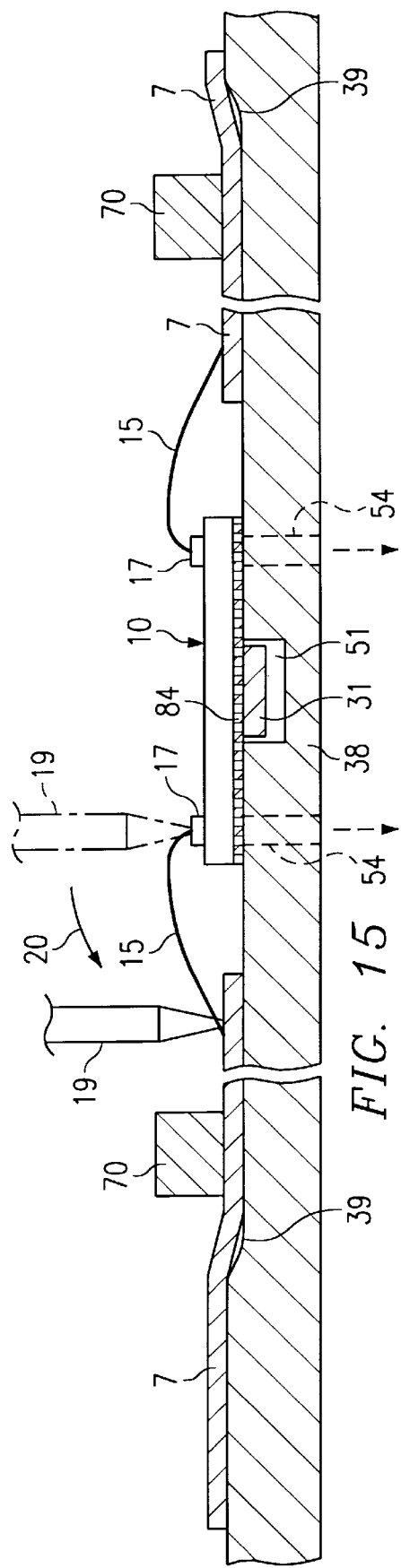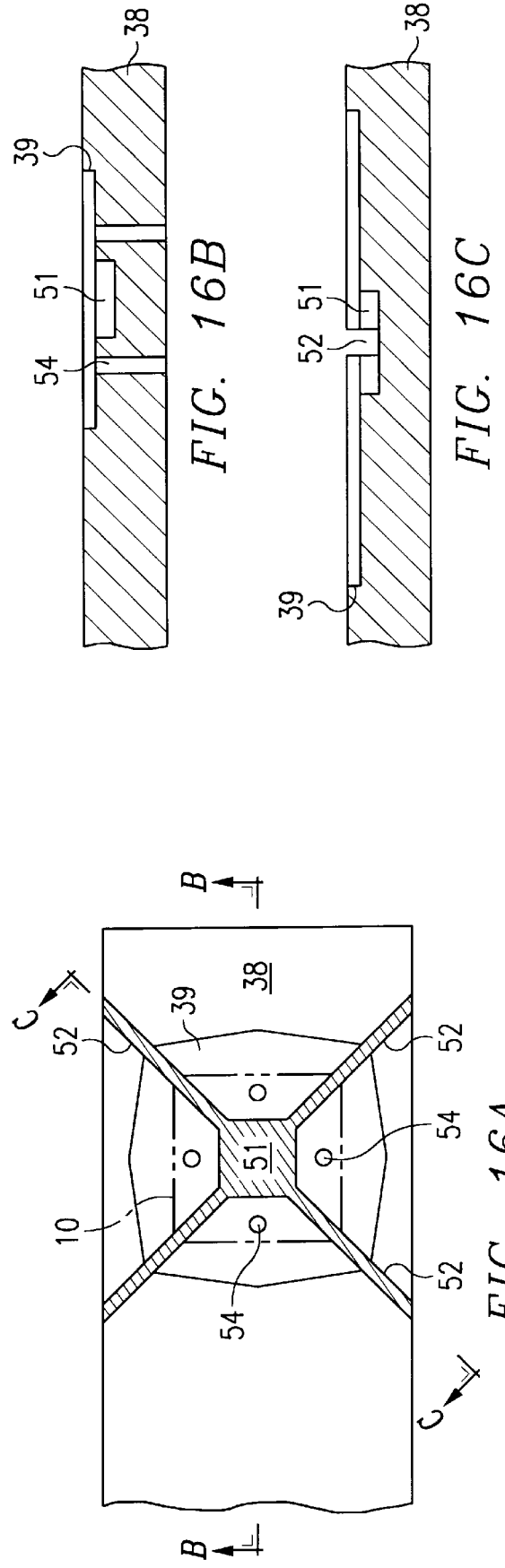

ACRYLIC GROUP CHEMICAL COMPOUNDS
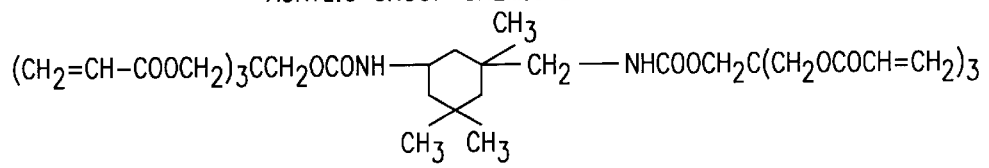
THERMOPLASTIC POLYIMIDE GROUP RESIN
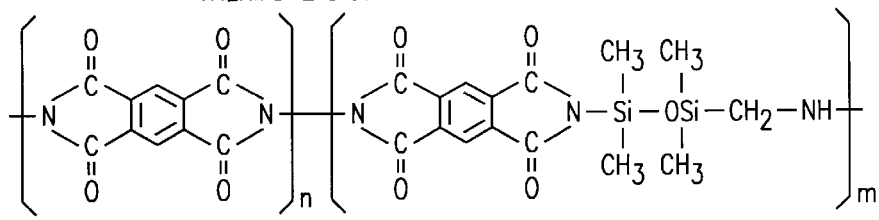
*FIG. 17*
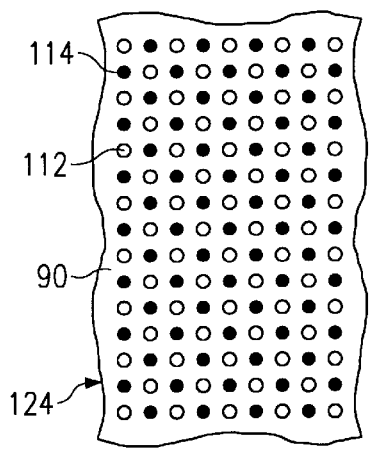
*FIG. 18A*
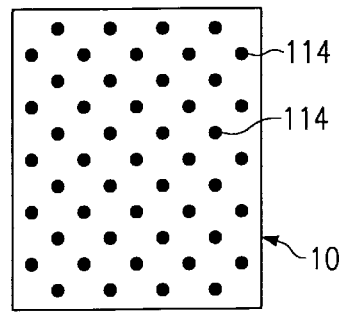
*FIG. 18B*
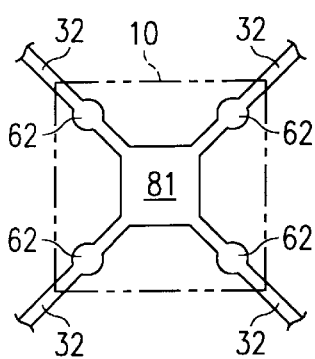
*FIG. 19A*
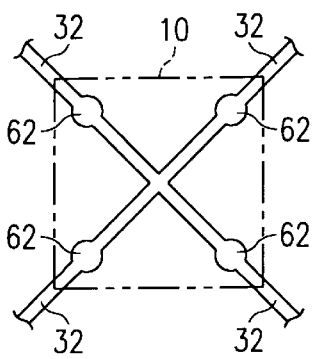
*FIG. 19B*
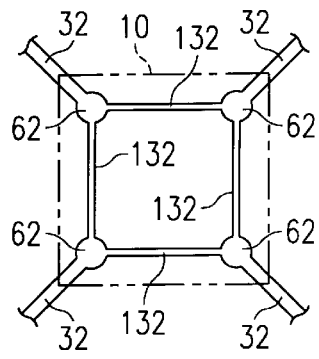
*FIG. 19C*

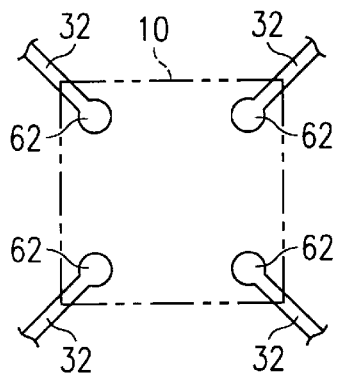
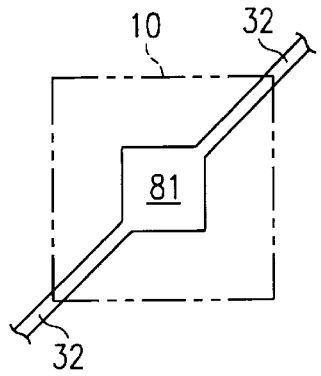
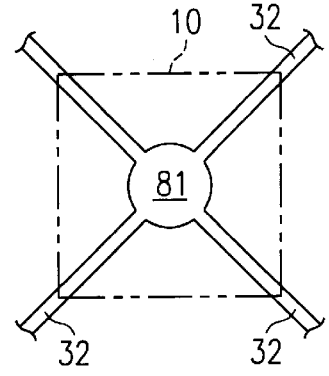
FIG. 19D  FIG. 19E  FIG. 19F
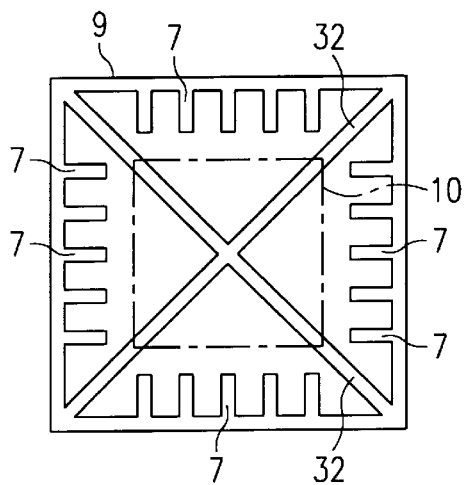
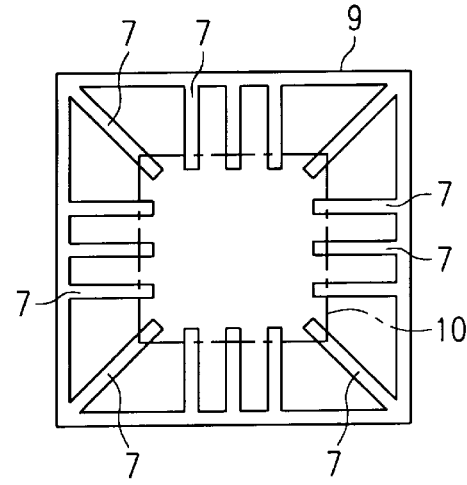
FIG. 20A  FIG. 20B
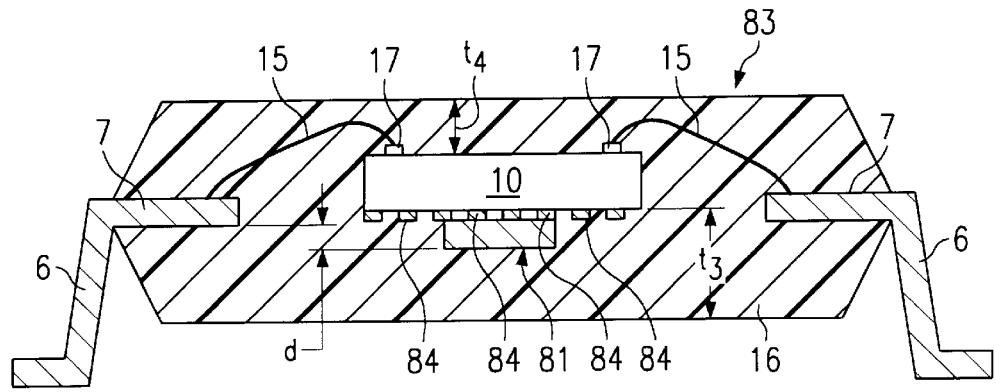
FIG. 21

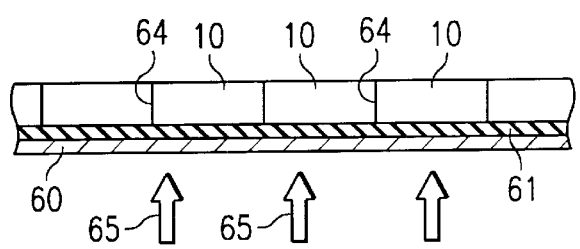
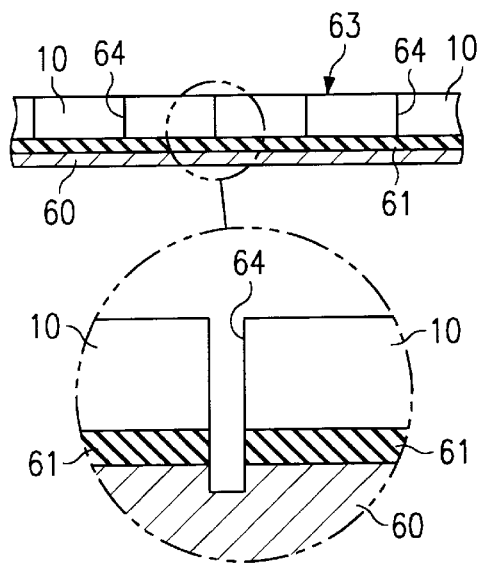
FIG. 48
FIG. 49
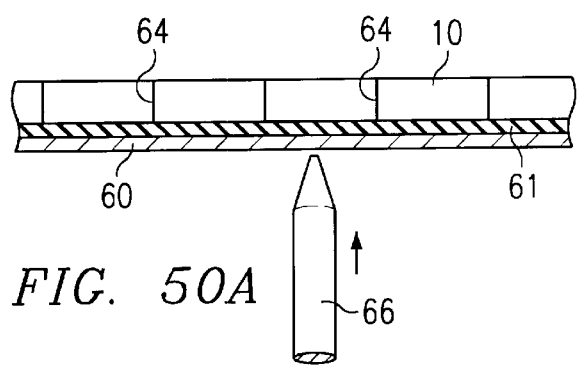
FIG. 50A
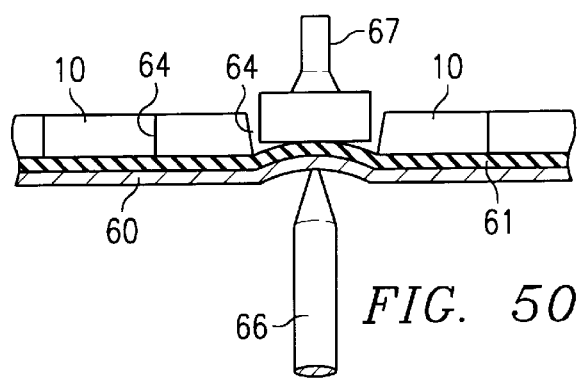
FIG. 50B
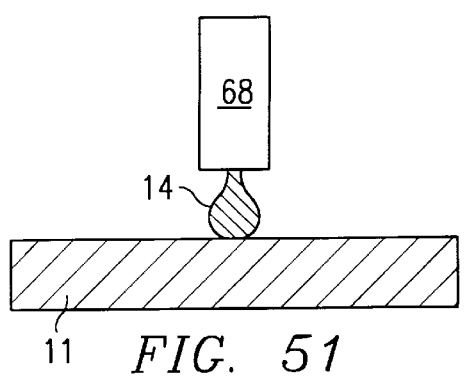
FIG. 51
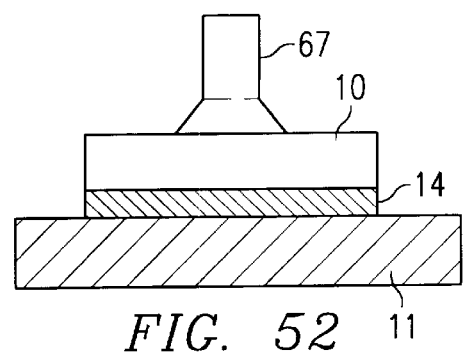
FIG. 52

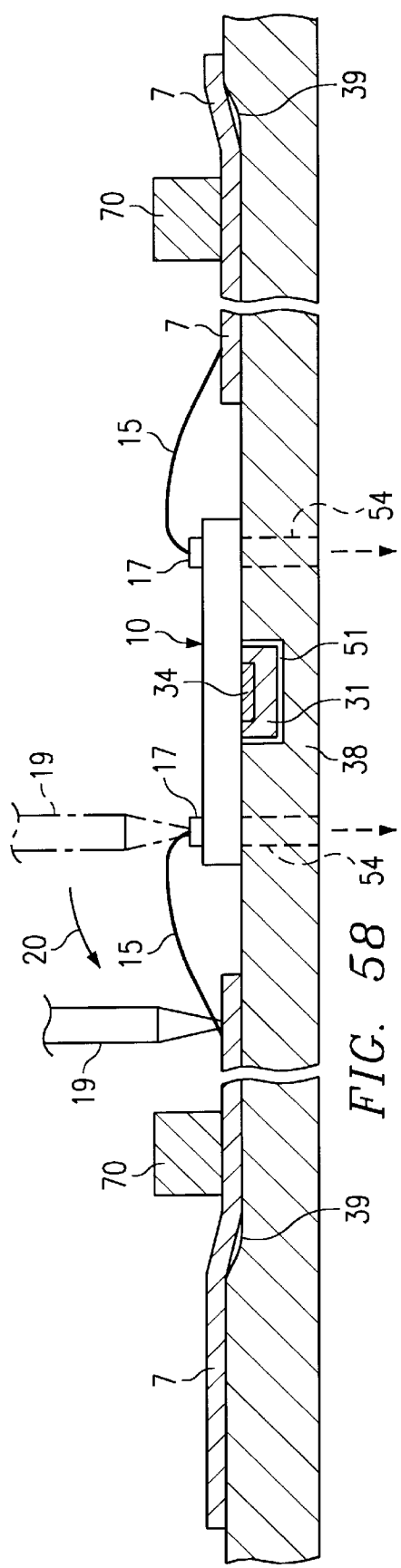
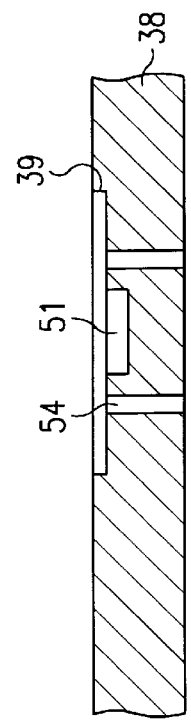
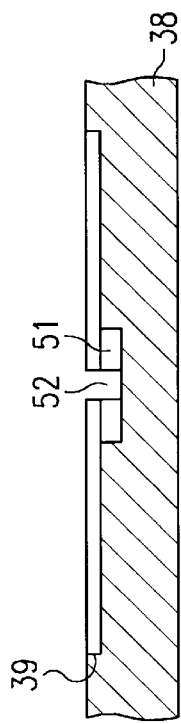
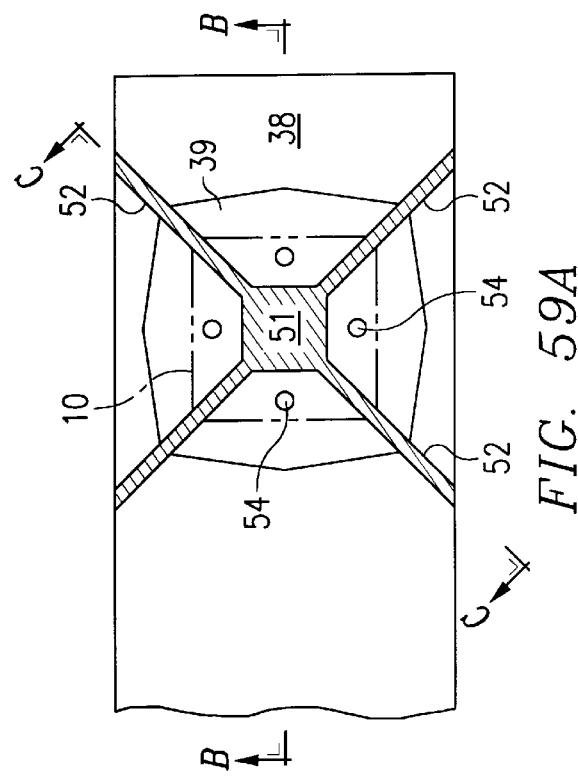
FIG. 58
FIG. 59B
FIG. 59C
FIG. 59A

SEMICONDUCTOR DEVICE, ITS MANUFACTURING METHOD, AND DICING ADHESIVE ELEMENT THEREFOR

This is a division of application Ser. No. 08/721,083, filed Sep. 26, 1996 now abandoned.

FIELD OF THE INVENTION

Our invention relates to semiconductor devices, and more particularly to integrated circuit (IC) chips in resin-sealed packages, and methods of making them, and a related dicing adhesive.

BACKGROUND OF THE INVENTION

In conventional IC chip mounting structures such as those of FIGS. 38–40, during mounting a lead frame element 1 like that in FIG. 41 is typically used. In lead frame element 1, the entire body is metal (for example, 42 alloy, copper alloy, copper, or the like), and an outer frame 2 of the lead frame and a lead frame section 8, which have multiple inner leads 7 extending outward in four directions in a radiating manner, are integrally formed by etching or the like.

In lead frame section 8, each outer lead 6 was connected by means of a connecting section (dam bar) 9 in the shape of a wire at each of its sides, and these connecting sections were joined by the outer frame 2 at each corner of lead frame 8.

Also, IC chip 10 is mounted on a mounting pad (die pad) 11, which has a large rectangular shape with a surface area greater than that of the IC chip. A support pin 12, which supports the mounting pad, is connected to mounting pad 11, and is unitized with the outer frame 2 at the corners. In the fig., 4 represents a hole for positioning the lead frame element.

A semiconductor package 13, wherein the IC chip 10 has been fastened and wire-bonded using the lead frame element 1 formed in this manner, as shown in FIG. 42, the IC chip is further resin-sealed by, for example, transfer molding, and as shown in FIGS. 38–40, is mounted (affixed) on mounting pad 11 with a silver paste 14, a pad 17 is bonded to inner leads 7 by means of wires 15, and a construction wherein the entire body the IC chip is further sealed with a resin 16 of the epoxy group or the like is realized. In FIG. 40 the alternate long and short dash line indicates the position of the outer line of sealing resin 16, and the alternate long and two short dashes line indicates that of the IC chip 10.

In constructing this package 13, first, as shown in an enlarged manner in FIG. 39, the IC chip 10 is mounted on mounting pad 11 with silver paste 14.

Then, as shown in FIG. 42, during wire bonding, a heater element (heater insert or heater block) 18 is placed in contact with the bottom side of mounting pad 11, and as well as supporting mounting pad 11, the heater also heats the bonding section (pad 17).

Bonding the wire 15 to the bonding pad 17 is done using a capillary 19 while supplying heat and ultrasonic wave energy, which is then further guided to the inner lead 7 as indicated by an arrow 20, and pressure bonded.

In the conventional package construction, the mounting pad 11 for the IC chip 10 was made larger than the IC chip 10, mainly for the following reasons. First, during the bonding, as shown in FIG. 43, if the mounting pad 11 is smaller than the IC chip 10, since the inner portion of the mounting pad 11 does not contact the heater insert 18, due to the capillary 19 during the ultrasonic wave operation, the IC chip 10 bends, its support becomes unstable, and the ultrasonic wave energy is not used effectively. Also, because the heat from the heater insert 18 is not delivered to the IC chip 10 with good efficiency, incomplete bonding occurs. As a result, making the mounting pad 11 smaller than the IC chip 10 is not readily conceivable by those skilled in the art.

Also, when soldering the resin-sealed package 13 to a circuit pattern 22 on a printed-wiring board 21, as shown in FIGS. 44 and 45, solder 23 is melted by means of solder reflow (for example, IR reflow using infrared radiation), and is further cured; however, as shown in the fig., these instances may cause a crack 24 to be generated in the resin 16.

Conventionally, by using a package 13 with a sufficient total thickness, a crack 24 is not readily generated in the case, but if thin and large chips are desired, as has been the case in recent years, in a conventional mounting pad 11 peeled sections 25 are readily generated at the boundary of the resin 16 or silver paste, as shown in FIG. 45, and the phenomenon of crack (24) being generated at the edge 11a of pad 11 is frequently observed.

Since the coefficient of thermal expansion of the IC chip and the resin differ, deformation remains in the inner portions of the package after resin molding and curing are completed, causing warpage to occur, in some instances to the extent that the package itself ends up being deformed.

Another cause of cracks is that the silver paste 14 for affixing the IC chip 10 has extremely high moisture absorption; the resulting moisture content contributes to the occurrence of steam explosions during heating operations, such as during IR reflow.

As shown in FIG. 45, pad 11 is deformed by the condensed water bringing about a steam explosion, in the same way as mentioned above, in a portion of the silver paste 14, a large stress is applied to resin 16, and crack 24 is generated at the edge 11a of pad 11 in particular.

The package 13 of FIG. 38 can be manufactured using the processes of FIGS. 46–52.

First, as shown in FIG. 46, a UV curing adhesive 61, which has, as its main component, a resin containing an ultraviolet (UV) curing agent, is applied on top of a heat-resistant base film 60 in the form of a tape that has been molded using polyethylene, polyolefin, or the like, to form the dicing tape 72.

Next, as shown in FIG. 47, semiconductor wafer 63 is adhered to dicing tape 72 with adhesive 61. The processes necessary in the manufacture of semiconductor elements, such as impurity diffusion processes and insulating coating processes, have already been done on this semiconductor wafer 63.

Next, as shown in FIG. 48, the semiconductor wafer 63 diced using a dicing saw, and the scribe lines 64, which divide the wafer into semiconductor elements (IC chips) 10, are formed. The scribe line 64 passes through the adhesive 61 from the semiconductor wafer 63 and reaches the surface of the base film 60.

Next, as shown in FIG. 49, ultraviolet rays 65 are radiated on the adhesive 61 from the base film 60 side, and the adhesive is cured. As a result of this UV curing, the IC chip 10 and the adhesive 61 can be easily peeled apart.

Next, as shown in FIG. 50, at the position of each IC chip 10, ejector pin 66 is pushed or poked up (FIG. 50(A)) from the base film side, the IC chip 10 that has become the object is lifted, and the IC chip 10 is peeled off the adhesive 61 (base film 60) at the scribe line 64 (FIG. 50(B)). Then, the peeled away IC chip 10 is drawn up by means of vacuum chuck 67, individually separated, and taken away.

Next, as shown in FIG. 51, a silver paste 14, which serves as the mounting material, is dripped from the dispenser nozzle 68 onto each mounting pin 11 of a lead frame 1, like that of FIG. 41.

Next, the curing process (mounting curing) is carried out for a prescribed amount of time at a rising temperature, for example, about 4–6 h with the temperature rising to 180° C., the resin (epoxy resin or the like) within the silver paste 14 is cured, the IC chip 10 is affixed to the top of the mounting pad 11, and the mounting of the IC chip 10 is completed.

However, in the method for mounting the IC chip 10 in this manner and with this mounting structure, mainly, the following problems (1)–(3) exist.

(1) Since the IC chip 10 is mounted with silver paste 14, for the reason, involving the absorbed moisture content of silver paste 14, steam explosions occur during IR reflow and package cracks (24 in FIG. 45) are readily generated.

(2) The mounting curing process takes a great deal of time in order to cure silver paste 14, which is inconvenient from the standpoint of productivity, process management, and the like.

(3) Because adhesive 61 is used to affix the semiconductor wafer 63 to the dicing tape 72 during dicing, and silver paste 14 is used to affix the IC chip 10 to the mounting pad 11 during mounting, these are essentially separate operations and they must be applied separately.

Inventor Umehara of the present joint invention assigned to Texas Instruments Inc., in copending sole U.S. patent application Ser. No. 08/258,119 filed Jun. 10, 1994 also assigned to Texas Instruments Inc. (a U.S. counterpart of Japanese Patent Application No. Hei 5[1993]-165248), hereby incorporated by reference, proposed a semiconductor device, its manufacturing method, and a lead frame (hereafter inventions of an earlier patent application) wherein the generation of cracks and warpage in the sealing resin is remarkably reduced or prevented, and wherein the bonding of the IC chip and the leads can be done stably and with good efficiency.

The inventions of the earlier patent application pertain to a semiconductor device that, in a resin-sealed condition, is affixed to a mounting section (for example, an additional mounting section for a mounting pad and/or support pin) that is smaller than the semiconductor element, and a lead frame that has the mounting section.

In the semiconductor device and lead frame of the inventions of the earlier patent application, a cavity is formed in the mounting surface of the mounting pad, and it is preferable that the adhesive used for affixing the semiconductor element be used to full this cavity. Also, it is preferable that the side surfaces of the mounting pad be slanted inward from the semiconductor element mounting surface on opposite sides.

The side surfaces of the support pin that supports the mounting pad can be slanted inward from the semiconductor element mounting surface on opposite sides as well. Also, an additional mounting section can be provided on the support pin, and the semiconductor element can be affixed to this mounting section. In this case, a cavity is formed in the additional mounting section of the support pin, and the adhesive used to affix the semiconductor element can be used to fill this cavity.

It is preferable that the semiconductor device of the inventions of the earlier patent application be manufactured using a method wherein, in regard to the lead frame (in particular, a lead frame with a mounting pad that is smaller than the semiconductor element), the mounting pad and/or support pin is fitted into an insertion cavity that has been formed in the heater element, and in this condition, the heater element contacts the semiconductor element that has been affixed to the mounting pad and/or support pin, and the semiconductor element and the inner lead section of the lead frame are bonded.

An insertion cavity for the support pin of the mounting pad can be formed in the heater element used in this manufacturing method. Also, it is preferable that the mounting pad insertion cavity be made larger than the mounting pad.

FIGS. 53–62 show embodiments of the inventions of the earlier patent application, and the same reference numerals are used to indicate parts that are the same as those in the conventional embodiment of FIGS. 38–52, and further explanations of these parts are omitted.

By means of the semiconductor package 53 and lead frame 41 of the embodiment of the inventions of the earlier patent application, in contrast to the previously mentioned common knowledge of those skilled in the art, the fact that the rectangular mounting pad (die pad) 31 to which the IC chip 10 is mounted (affixed) is made smaller than the IC chip 10 is a major distinguishing feature (this mounting pad 31, in a sense, can be called a "small die pad").

Also, one other important distinguishing feature is the fact that a rectangular cavity 30 is formed in the chip mounting surface of mounting pad 31, and along with the adhesive 34 used for affixing the IC chip 10 by filling this cavity with silver paste or the like, the adhesive 34 does not adhere to the joining surface 50 of the mounting pad 31 and IC chip 10 (the affixing surface for the adhesive 34 is almost within the same plane as the mounting surface of mounting pad 31).

The surface area of the mounting pad 31 can be made 15–40% of the size of IC chip 10, but considering the influence and stress caused by the IC chip 10 being mispositioned during the later described handling or the amount of silver paste, it is thought that smaller is more preferable. For example, when the size of the IC chip 10 is 8 mm×8 mm, it is believed that the mounting pad 31 should be about 4 mm×4 mm (about 25% of the surface area of the IC chip 10).

This type of a mounting pad 31, along with this support pin 32 (as well as, each lead 6,7 and the like), is integrally formed by means of etching or the like as the lead frame 41 as shown in FIG. 57. The cavity 30 in mounting pad 31, represented by the slanted lines in FIG. 54, can then be formed by half etching, but its depth (d) can be used as the thickness allowance (for example, about 30 μm) of the silver paste 34, as shown in FIG. 55.

In the lead frame 41, among the four corners of the lead frame section 8, only one corner (in FIG. 57, the upper right corner) is directly affixed to the lead frame outer frame 2 in the same manner as shown in FIG. 41, but the other three corners are respectively connected to the lead frame outer frame 2 through the medium of three snaking bent sections 22,23,24.

Using this lead frame 41, even if thermal expansion occurs in lead frame section 8 during a heating process, such as wire bonding, the deformation stress that can be generated in the four directions of up, and down, right and left, come to be effectively absorbed by the elastic deformation of bent sections 22,23,24. As a result, the dimensional positioning precision (spacing and the like of the leads) of lead frame section 8 itself is improved, and since there is no deformation of the lead frame element itself, its transportability becomes excellent, and smooth transport becomes possible.

Moreover, when resin sealing is done after mounting the IC chip, even if a force is generated that attempts to stretch the leads 6,7 due to the contraction of the resin, this is absorbed by the deformation of bent sections 22,23,24; as a result, the deformation and deformation of the lead frame element can be prevented, and reliability, such as moisture resistance and the like, is also improved.

Next, the mounting and bonding processes for the IC chip 10 using the lead frame 41 will be explained.

First, the IC chip 10 is affixed (mounted) with silver paste 34 on top of mounting pad 31, as shown in FIG. 55. Beforehand, the silver paste 34 is used to fill cavity 30 of mounting pad 31, and the IC chip 10 is affixed by a mounting curing.

Next, as shown in FIGS. 58 and 59, the heater element (heater insert) 38, wherein the rectangular cavity 51 and radiating linear cavities (grooves) 52 are provided for inserting mounting pad 31 and support pin 32, is prepared. In FIG. 59, the cavities 51,52 are represented by the slanted lines.

Then, as shown in FIG. 60, when the mounting pad 31 and support pin 32 are inserted into each of the cavities 51 and 52 provided in the heater element (heater insert or heater block), and the back surface of the IC chip comes into contact with the heater element.

Because steps 39 are provided on the heater element surface, if the inner lead group 70 is pressed at the periphery of the IC chip, (See FIG. 58), the tip regions of the inner leads 7 positively contact the heater element, and as mentioned previously, thermally and mechanically stable contact is ensured, and stable bonding can be carried out.

A spacing of slightly less than about 500 μm can be provided between each of the cavities 51 and 52 of the heater element and the mounting pad 31 and support pin 32 on the IC chip periphery.

In regard to the wire bonding, in the same manner as mentioned previously, wire 15 is supplied to pad 17 using capillary 19 while applying heat and ultrasonic wave energy, further guided to inner lead 7 as indicated by arrow 20, and pressure bonded.

Although mounting pad 31 is smaller, because it is sufficiently supported on heater insert 38, wire bonding can be done stably, the heat of the heater directly reaches the IC chip 10 from the heater insert 38, and there is no heating efficiency loss.

A through-hole 54 is formed in heater insert 38 as indicated by the broken line, and by applying vacuum suction through this through-hole, the IC chip 10 can be held on top of the heater insert 38 by suction, and can be stably supported. Also, in addition to this, the IC chip 10 can be mechanically fastened to the heater insert 38 using a clamp (not shown) or the like.

Once wire bonding has been completed using ordinary methods, sealing is done using resin 16, as shown in FIG. 53, the unnecessary portions of the outer leads 6 are cut off, and the semiconductor package 53 is completed.

Mounting pad 31 is made smaller than the IC chip 10, and because silver paste 34 is used to fill the cavity 30, the package 53 and the lead frame 41 enable the following remarkable operating defects (a)–(e) to be realized.

(a) Because mounting pad 31 is small, the moisture in the vicinity of pad 31 is accordingly reduced by that amount, the deformation caused by the differences in the coefficients of thermal expansion and contraction of the pad 31 are also reduced, when heated (for example, during IR reflow and resin sealing) peeling does not occur between the pad 31 and the resin 16 as a result of the steam explosions explained in FIG. 44, and the generation of cracks in the resin is eliminated or reduced greatly.

(b) In this case, since the resin 16 is directly adhered to the IC chip 10 on the periphery of pad 31, due to the fact that the adhesion between silicon (IC chip 10) and epoxy resin (sealing resin 16) is generally very good, the peeling at the boundary of resin 16 and IC chip 10 does not readily occur, and the chance of the previously mentioned collection of water in this boundary and the occurrence of steam explosions are reduced another level.

(c) Moreover, the silver paste 34 is used to fill the cavity 30 of the pad 31, and it does not appear on top of the joining surface 50 of the IC chip 10 and pad 31. Because the amount of silver paste can be reduced, in addition to achieving cost reductions, the discharge and diffusion of the waters originating in the silver paste and discharge of absorbed gases are slight, and the generation of cracks in the resin 16 as a result of the steam explosions, as shown in FIG. 45, are eliminated or reduced greatly. Also, one can get by without using a low-stress epoxy resin as resin 16, and as a result, the amount of gas discharged from the silver paste can be further reduced.

(d) Because silver paste 34 is used to fill the cavity 30, the total thickness of the mounting pad 31, silver paste 34, and IC chip 10 is reduced by exactly the thickness of the silver paste compared to the conventional example of FIG. 38, and the total thickness of the package can be made smaller.

(e) Since the mounting pad 31 is small, the size of the IC chip 10 mounted on top of it becomes independent of the size of the mounting pad 31, and there is more freedom in selecting the chip size to be mounted.

Also, since the method for manufacturing this package 53 uses a heater insert 38 with mounting pad insertion cavity 51, and bonding is carried out by directly supporting the periphery of the IC chip 10, the following remarkable operating effects (f)–(g) can be exhibited.

(f) During wire bonding, as shown in FIGS. 58 and 59, even though the mounting pad 31 is small, the pad can be positively supported on top of heater insert 38, and moreover, because pad 31 and pin 32 are inserted into the cavities 51 and 52 of the heater insert 38, the support is made more stable by an additional level. Therefore, it becomes possible to stably carry out the wire bonding.

(g) Also, in this case, since the IC chip 10 directly contacts the heater insert 38, there is no loss in the heat transfer from the heater and the ultrasonic wave energy to the IC chip (in particular, pad 17), the bonding strength is well preserved, and sufficient bonding can be realized even if the heat of the heater and the ultrasonic wave energy of capillary 19 are lowered.

Instead of a mounting pad 31 like that of FIGS. 53–60, the various mounting pads of FIG. 61 can be utilized.

As for the example of FIG. 61(*a*), the mounting pad 31 and the cavity 30 are made round, as opposed to the example of FIG. 56. In FIG. 61(*d*), if the adhesive strength of the IC chip 10 is insufficient for holding it together with the mounting pad 31, an additional mounting section 62 is provided with a circular shape on support pin 32, and by additionally affixing the IC chip 10 with this mounting pad section 62, the adhesive strength of the IC chip 10 on top of the lead frame can be increased. In this case, it is preferable that the cavity 63, in which the silver paste used for affixing the chip is filled, be formed by half etching or the like.

Additional pads are of FIGS. 61(c), (d), and (e), but these are not mounting pads for the central section like that in FIG. 61(b). The mounting section 62 is not limited to being circular, and can take on various shapes, such as triangular, rectangular, some other polygonal shape, or elliptical.

As shown in FIGS. 61(b)–(d), in the example that provides the mounting section 62 on the support pin 32, the number of mounting sections 62 is determined according to the size of the IC chip and the package (in this case, four), and sufficient adhesive strength is imparted to IC chip 10. Also, in the event that the chip is small, mounting can be done using only the mounting pad 31, as shown in FIG. 61(a), but when mounting a large IC chip, mounting sections 62 should also be provided on the support pins 32, as shown in FIGS. 61(b)–(e), and the pitch (distance) between each mounting section 62–62 is made large.

The reason for using four mounting sections 62 and changing the pitch between the mounting sections based on the chip size in this manner, as shown in FIG. 62(A), is so that the distance (l) between the affixing position of the chip 10 and the dam bar 9 can be made as short as possible.

During resin molding, if the flow balance of the resin between each side of the upper mold and lower mold is not constant, the mounting section (the chip affixing position) experiences forces in the upward and downward directions, and causes a "floating up" wherein the mounting section completely floats; but at this time, as is clear from FIG. 62(B), the bowing of the support pin is largely managed by the distance (l') between both support points (in this case, the dam bar 9 and the chip affixing position). The bowing of the support pin decreases the shorter this length (l') becomes (equivalent to the distance (l)); therefore, the floating of the mounting section is small, which is advantageous.

In this way, in order to make this the distance (l) as short as possible, it is preferable that the chip 10 be adhered to the support pin 32 closer to the dam bar 9 on the diagonal line of the support pin 32. All of the lead frames of FIGS. 61(b)–(e) were designed with this fact in mind.

When the inventors of this invention conducted additional investigations in regard to the inventions of the earlier patent application, the various advantages were realized; however, the fact that still more points existed that need to be improved was realized. The problems with the inventions of the earlier patent application that needed to be improved are of the following (1)–(6).

(1) Because mounting pad 31 and mounting section 62 are small and have a small die pad structure, the back surface of chip 10 and the molding resin 16 are directly attached, which allows the generation of cracks. However, the surface roughness of the back surface of the chip is different with each semiconductor wafer, and when the surface roughness is high, the organic substances of the dicing tape 62 readily transfer to the back surface of the chip, and because the adhesion between the back surface of the chip and the molding resin is weakened as a result, there are instances when the resistance to cracking becomes poor.

(2) Because mounting pad 31 and mounting section 62 are small, the process control during die attachment, particularly the control of the amount of silver paste 34, becomes very difficult, silver paste 34 comes out and leaks on the back surface of the pad, and there is a fear that package cracks may be generated as a result. Because of this, cavity 30 or 63 is added by half etching the upper surface of the mounting pad 31 or mounting section 62, forming a dam for the silver paste. However, when changing the manufacturing process for the lead frame from etching to stamping in order to achieve cost reduction, stamping the cavity in the wafer mounting pad is difficult.

(3) In order to alleviate the floating (pad drift) of mounting section 62 of support pin 32, and since four mounting sections are used and the pitch between any number of mounting sections varies, the minimum size of a chip that can be mounted on the lead frame is limited by the pitch between the mounting sections.

(4) When making the metal mold for stamping the lead frame, it is necessary that separate metal molds be made for each number of mounting sections and each pitch between the mounting sections.

(5) In order to reduce or eliminate the floating of the mounting section, it is preferable that the chip be adhered to the support pin by attaching the chip corner section on top of the support pin as close as possible to the dam bar, but in the construction of the small die pads of the current configuration, this is limited by the relationship between the positions of the inner lead sections.

(6) It is necessary to manufacture and convert the heater block 38 for wire bonding (see FIG. 58) and the dispenser nozzle 68 for die attachment (see FIG. 51) for each number of mounting sections 62 and each pitch between the mounting sections.

The first purpose of this invention is to eliminate or markedly reduce the generation of package cracks by adding a device to the mounting structure for the semiconductor element, and to improve the problem of productivity with mounting curing and mounting.

Also, a second purpose of this invention is to eliminate or markedly reduce the generation of package cracks, even when using special lead frames, and to allow the semiconductor element to be mounted on top of the lead frame made in this manner easily and with good reliability.

SUMMARY OF THE INVENTION

Our invention relates to a semiconductor device wherein the back surface of the semiconductor element (surface to be mounted) is affixed to a mounting section using a thermoplastic adhesive (for example, a thermoplastic polyimide: hereinafter, the same).

According to the semiconductor device of this invention, since the back surface of the semiconductor element is affixed to the mounting section using a thermoplastic adhesive, the mounting material has a thermoplastic adhesive as its main component, and is not made of a silver paste 14 or 34 as presented previously. In regard to the thermoplastic adhesive, the adhesion with silicon or epoxy is extremely high, and due to the fact that the glass transition point is higher than the reflow temperature, condensation breakdown can be prevented (as for the hygroscopicity itself, that of the polyimide is higher, but in addition to that, the adhesion is stronger), and because steam explosions are not generated during heating that was caused by the absorbed moisture content when silver paste was as the mounting material, a package with excellent reliability can be offered wherein the generation of package cracks is eliminated (or markedly reduced).

Also, even if the mounting section on which the semiconductor element is mounted is a special mounting, such as the previously mentioned small die pad 31, because a thermoplastic adhesive is supplied beforehand on the back surface of the wafer in an excellent configuration, the problem in which the adhesive leaks onto the back surface of the pad is eliminated, and therefore, volumetric control of the mounting material dispenser is not longer necessary, and even if the mounting section itself is poor, the assembly of the semiconductor device is still possible.

Also, in regard to the thermoplastic adhesive that serves as the mounting material, because the heat-pressure bonding of the semiconductor element to the mounting section can be done by simple thermal processing for an extremely short period of time during the mounting of the semiconductor element, the productivity increases compared to mounting curing such as when the previously mentioned silver paste was used, and process control becomes extremely simple.

Also, the thermoplastic adhesive used as the mounting material is provided beforehand on the dicing tape, which is used for dicing the semiconductor wafer into semiconductor elements; it is transferred along with the divided semiconductor elements to its back surface, and because it offers a mounting process that allows the adhesive to be used as is, the adhesive used for mounting and the adhesive used for dicing can be the same, and the process that separately coats the mounting material can be omitted, which is extremely advantageous.

In the semiconductor device of this invention, the thermoplastic adhesive arranged on the back surface of the semiconductor elements can be applied locally on the back surface of the semiconductor elements, for example, it can be intermittently applied with a given pattern, such as a striped or dotted pattern. Also, this thermoplastic adhesive can be applied over almost the entire back surface of the semiconductor element.

In any case, there are no problems as long as the thermoplastic adhesive exhibits sufficient adhesive strength for the mounting section. Also, this adhesion is also sufficient when using special mounting sections, such as the small die pad 31.

In this case, it is advantageous from the standpoint of crack resistance for the back surface of the semiconductor element and the sealing resin to be directly adhered at the periphery of the mounting section. In particular, if the thermoplastic adhesive is applied over almost the entire back surface of the semiconductor element, because the semiconductor elements and the sealing resin are adhered by means of this adhesive, the adhesion that can be obtained increases compared to the case wherein the semiconductor element (for example, silicon) and the sealing resin are directly adhered. Also, in regard to the surface roughness of the back surface of the semiconductor elements, the surface roughness does not differ very much between each semiconductor wafer (or each semiconductor element), due to the thermoplastic adhesive. This means that the difference between the surface roughness and the surface roughness itself becomes small, organic materials from the dicing tape do not readily transfer to the semiconductor elements during dicing, the adhesion of the semiconductor element and the sealing resin increase another level, and the crack resistance further increases.

Also, in the semiconductor device of this invention, the semiconductor elements can be resin-sealed in a state in which it is affixed to the support pin using the thermoplastic adhesive.

In this case, since the semiconductor element is directly mounted on the support pin, it is not necessary to provide the mounting pad 11 or small die pad 31. In the mounting structure, a mounting pad or die pad (island) with sufficient surface area had to be added together with the support pin; but the need for this additional pad is eliminated, the semiconductor device element can be mounted using only the support pin since the thermoplastic adhesive serves as the mounting element, and the mounting can be done easily with good productivity.

Therefore, since this mounting structure is formed without a pad itself by using a special lead frame, the die pad that used silver paste is unnecessary, and the generation of package cracks as a result of the leakage of the mounting material is no longer a problem. Moreover, in order to affix the semiconductor element to the support pin, the corner or the periphery of the semiconductor element can be sufficiently affixed, and the floating of the mounting section, as was previously mentioned, can be alleviated. In this case, since the corner of the semiconductor element can be attached as close as possible to the dam bar, the floating of the mounting section caused by resin pressure during resin molding can be more than sufficiently prevented.

Also, because a mounting pad is not provided and the mounting is done with only a support pin, along with being able to easily manufacture the lead frame by means of stamping, there are no restrictions on the mounting size of the moldable semiconductor element. For example, it can be selected simply according to the wire length of the wire bonding.

Moreover, since there is no pad, there is no need to manufacture metal molds for separate stampings depending on the number and pitch of the mounting sections (pads), and the metal mold can be used for all lead frames. In the same manner, there is no need to separately manufacture the heater block for wire bonding depending on the number and pitch of the mounting sections, the package size, and the number of pins; these can all be used interchangeably. Also, a die attachment is also unnecessary, and the problems with the manufacture of the dispenser nozzle are not created.

The effects obtained by affixing the semiconductor element directly to the support pin in this manner are the same as those that can be obtained by using the mounting structure wherein the semiconductor element is resin-sealed in a state in which it is affixed to the inner lead section using a thermoplastic adhesive.

Also, this invention in regard to the method for manufacturing semiconductor devices according to this invention, offers a method for manufacturing semiconductor devices that consists of a process in which a semiconductor wafer is adhered to a dicing adhesive element (for example, a dicing tape) by interposing at least a thermoplastic adhesive (for example, a thermoplastic polyimide: hereinafter, the same); a process in which the semiconductor wafer is divided into semiconductor elements by dicing the semiconductor wafer in this adhered condition; a process in which this semiconductor element, along with the thermoplastic adhesive, is separated from the dicing adhesive element; and a process in which this separated semiconductor element with the thermoplastic adhesive is heat-pressure bonded to a mounting section for the lead frame.

According to this manufacturing method, the thermoplastic adhesive used as the mounting material is provided beforehand on the dicing tape for the semiconductor wafer, which is used during the dicing in which the wafer is divided into semiconductor elements, and after being divided is transferred along with the semiconductor elements to its back surface, and because it offers a mounting process that allows the semiconductor element to be used as is, the adhesive used for mounting and the adhesive used for dicing can be the same, and the process that separately coats the mounting material can be omitted, which is extremely advantageous.

Also, because the thermoplastic adhesive that serves as the mounting material allows the semiconductor element to be heat-pressure bonded to the mounting section by means of a simple thermal processing for an extremely short period of time during the mounting of the semiconductor element, the productivity is increased compared to that of the mounting curing, such as when the silver paste is used, and process control becomes extremely simple.

In this manufacturing method, the semiconductor wafer and the adhesive element used for dicing are adhered by interposing a curing adhesive (for example, a UV curing adhesive, which has, as its main component, a resin containing an UV curing agent) along with the thermoplastic resin intermittently in a pattern, such as a striped or dotted pattern; after dicing the curing adhesive is cured, this cured adhesive is made so as to remain on the adhesive section used for dicing, and the semiconductor element, along with the thermoplastic resin, can be separated from the adhesive element used for dicing.

In this case, dicing is carried out while the semiconductor wafer is in a state in which is adhered to and supported on the dicing adhesive element by means of the curing adhesive used for dicing. After dicing, the curing adhesive is cured and is easily peeled off the semiconductor element, only the thermoplastic adhesive is transferred to the semiconductor element side, and can then be moved as is to the subsequent mounting process. Therefore, the thermoplastic resin is used not only for dicing but also for mounting, and can serve as a mounting material.

However, during dicing, the semiconductor wafer and the adhesive element used for dicing can be adhered without using the curing adhesive, by interposing, for example, only the thermoplastic adhesive over nearly the entire back surface of the semiconductor element; but in this case, only the thermoplastic resin has the function of affixing the semiconductor wafer to the adhesive element during dicing, and after dicing, serves as the mounting material. It is preferable that the physical properties (glass transition temperature and the like) of the thermoplastic adhesive be selected so as to fulfill both functions.

During the mounting of the semiconductor element, it is preferable that the adhesion be sufficiently brought out by heating it to a temperature that is above the glass transition temperature of the thermoplastic adhesive, and that the semiconductor element be thermally bonded to the mounting section of the lead frame.

Also, it is preferable that the glass transition temperature of the thermoplastic resin be higher than the heater temperature so that the semiconductor element does not adhere to the heater element through the thermoplastic adhesive when bonding the semiconductor element to the inner lead section of the wire frame, for example, by wire bonding.

Even in the manufacturing method according to this invention, a mounting pad that is smaller than the semiconductor element is provided, and the semiconductor element can be resin-sealed in a state in which it is affixed to the mounting pad using the thermoplastic adhesive.

Also, it is preferable that the semiconductor element be resin-sealed in a state in which it is affixed to a support pin using the thermoplastic adhesive. It can also be resin-sealed in a state in which the semiconductor element is affixed to the inner lead section using the thermoplastic adhesive.

This invention also offers, as the dicing adhesive element used in the manufacturing method, a dicing adhesive element wherein at least a thermoplastic adhesive (for example, thermoplastic polyimide: hereinafter, the same) is provided on a base material.

In this dicing adhesive element, a thermoplastic adhesive and a curing adhesive (for example, a UV curing adhesive, which has as its main component a resin containing an ultraviolet hardener) can be applied or printed intermittently on top of the substrate in a pattern, such as a striped or a dotted pattern. Also, just a thermoplastic resin can be applied on top of the substrate.

BRIEF DESCRIPTION OF THE DRAWINGS

FIG. 15 is a cross section showing another processing step of this same manufacturing process.

FIG. 16 is a plan view, FIG. 16B is a cross sectional view along line B—B and FIG. 16C is a cross sectional view along line C—C showing a processing step of the manufacturing-process of FIG. 15.

FIG. 17 shows the constitutional components for the UV curing adhesive and each constitutional formula for the thermoplastic polyimide that serves as the mounting material used in this same package.

FIGS. 18A–B are plan views showing the processing steps for the manufacturing process of a semiconductor package (semiconductor device) according to another embodiment of this invention.

FIGS. 19A–F are plan views of the essential components of the lead frame section according to another embodiment of this invention.

FIGS. 20A–B are plan views of the essential components of the lead frame section according to another embodiment of this invention.

FIG. 21 is a cross section of a semiconductor package (semiconductor device) according to another embodiment of this invention.

FIGS. 47, 48, 49, 50A, 50B, 51 and 52 are cross sections showing further processing steps of this same manufacturing process.

FIG. 58 is a cross section of the main components of the package of FIG. 53 during wire bonding.

FIG. 59 is a plan view and each of its cross sections of a heater insert used in this same wire bonding.

Figure 1:
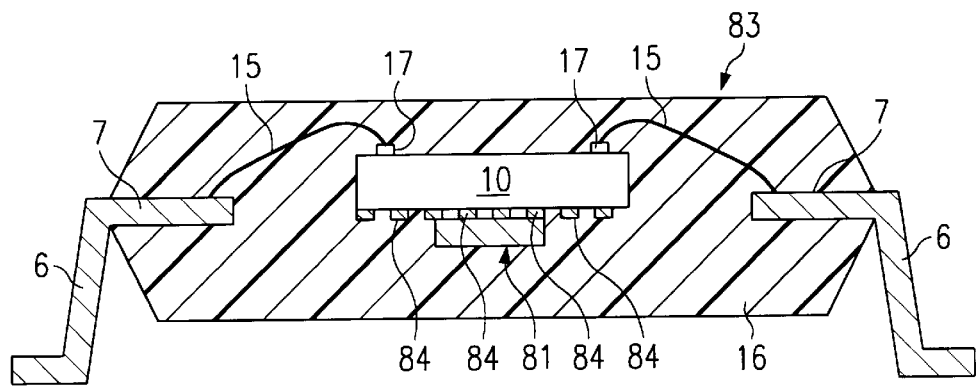
FIG. 1 is a cross section (along line I—I in FIG. 3) of a semiconductor package (semiconductor device) according to an embodiment of this invention.
Figure 2:
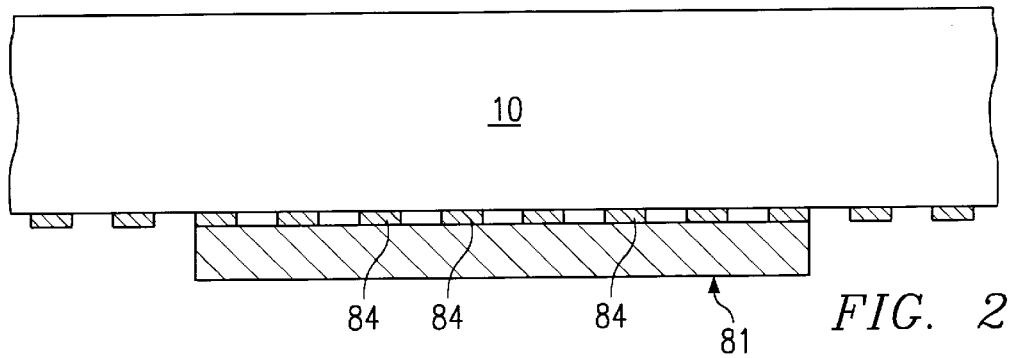
FIG. 2 is an enlarged view of the essential components of FIG. 1.

In the figures, 1, 41 and 91 are lead frames, 6 and 7 a lead, 8 a lead frame section, 9 a dam bar, 10 an IC chip, 11 a mounting pad, 13, 53, 83, 113 and 143 a semiconductor package, 14 and 34 a silver paste, 15 wires, 16 a sealing resin, 17 a bonding pad, 18 and 38 a heater insert (heater block), 19 a capillary, 21 a printed-wiring board, 22 a circuit pattern, 23 solder, 24 a crack, 25 a peeling section, 30 and 63 a cavity, 31 and 81 a mounting pad (Small die pad), 32 a support pin, 39 a set, 62 an additional mounting section, 63 a semiconductor wafer, 64 a scribe line, 67 a vacuum chuck, 70 an inner lead clamp, 702, 102 and 142 are dicing tape, 84 and 114 a thermoplastic polyimide, 90 a base film, 92 and 112 a UV curing adhesive, and 132 is an additional support pin section (connecting pin section).

DETAILED DESCRIPTION

FIGS. 1–17 show Embodiment 1 of our invention, in which the same reference numerals are used for components that are the same as those in the examples of FIGS. 38–62. According to the semiconductor package 83 and lead frame 91 of this embodiment, as in FIGS. 1–5, the rectangular mounting pad (die pad) 81 on which the IC chip 10 is mounted (affixed) is smaller than IC chip 10 as in the case of the mounting pad 31, and is formed as a small die pad, but it has major distinguishing features in that the thermoplastic polyimide 84 is used as the mounting material and the cavity to be filled with mounting material is not formed in the mounting pad 81.

The back surface of IC chip 10 is affixed to mounting pad (small die pad) 81 using the adhesive 84, which has as its main component a thermoplastic polyimide. This thermoplastic polyimide 84 is transferred from the later presented dicing tape, and for example, is arranged in a striped pattern. The mounting structure that uses a mounting material in this manner exhibits the following remarkable operating effects (A)–(F).

(A) This thermoplastic polyimide 84 is used as the mounting material, and as opposed to the silver paste 14 and 34 presented previously, it has the physical property in which its glass transition temperature is higher than the reflow temperature, and because its adhesive strength is also very high for silicon and molding resin, no boundary peeling occurs between the chip and the molding resin as a result of steam explosions during heating caused by absorbed moisture content, and allows a package with good reliability and no (or markedly reduced) package cracks to be realized.

(B) Also, the mounting section 81 on which the IC chip 10 is mounted is a special device, like the previously mentioned small die pad 31, but because the thermoplastic resin is supplied beforehand in an excellent configuration on the back surface of the wafer, the problem in which the adhesive leaks onto the back surface of the pad does not occur, and therefore, the volumetric control of the mounting material from the dispenser becomes unnecessary, and assembly of the semiconductor device is still possible even without a mounting section.

(C) Also, because the thermoplastic adhesive 84, which acts as the mounting material, allows the IC chip 10 to be heat-pressure bonded to mounting section 81 by a simple thermal processing for an extremely short period of time during the mounting of the IC chip 10 (for example, at 300° C. for 1–2 sec), the productivity is increased compared to that of mounting curing, such as when the previously mentioned silver paste is used, and process control becomes extremely simple.

(D) Also, as presented later, because the thermoplastic adhesive 84, which is used as the mounting material, is provided beforehand on the dicing tape for the semiconductor wafer, is used during dicing for dividing the semiconductor wafer into IC chips 10, and is transferred to its back surface along with the IC chip 10, and can be provided in the mounting process as the mounting material as is, it can be used as both the adhesive for mounting and the adhesive for dicing, and the process which separately coats the mounting material can be omitted, which is extremely advantageous.

(E) In the semiconductor package 83 of this embodiment, the thermoplastic adhesive 84 arranged on the back surface of the IC chip 10 can be applied locally on the back surface of the IC chip 10, for example, it can be intermittently applied in a striped pattern, but since the thermoplastic adhesive 84 has sufficient adhesion with respect to the mounting section 81, there are no problems. This adhesion is also sufficient for a special mounting section 81, such as a small die pad.

(F) In this case, in regard to crack resistance, it is advantageous for the back surface of the IC chip 10 and the sealing resin 16 to be directly adhered at the periphery of the mounting section 81. Also, even on a mounting section 81 that is not just that direct adhesion region, because the sealing resin 16 enters between the pattern of the thermoplastic polyimide 84 on the back surface of IC chip 10, the IC chip 10 and the sealing resin 16 are adhered by means of this adhesive, and the adhesion that can be obtained is increased compared to the case wherein the IC chip 10 (for example, silicon) and the sealing resin 16 are directly adhered.

The surface area of the mounting pad 81 can be made 15–40% the size of IC chip 10, and if the IC chip 10 being displaced during handling, which will be presented later, or by the effects and stress caused by the weight of the silver paste are considered; it is believed that smaller amounts are preferable. For example, when the size of the IC chip 10 is 8 mm×8 mm, it is believed that about 4 mm×4 mm is suitable for the mounting pad 81 (about 25% of the surface area of IC chip 10).

Figure 5:
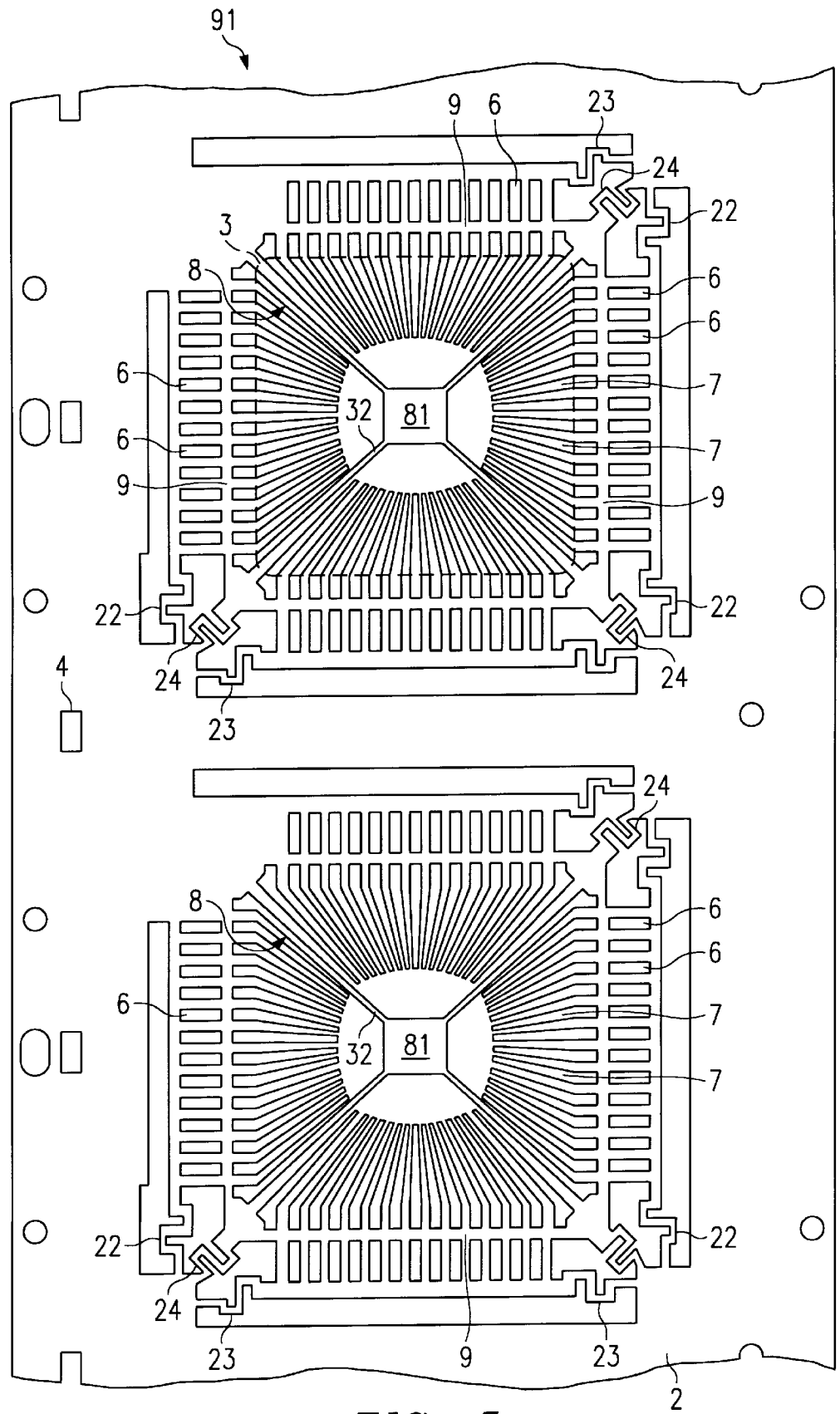
FIG. 5 is a plan view of one portion of this same lead frame.

This type of a mounting pad 81, along with this support pin 32 (as well as, each lead 6,7 and the like), is integrally formed by means of etching or the like as the lead frame 91 as shown in FIG. 5. Also, because the mounting pad 81 is flat, forming the lead frame 91, including this mounting pad, is possible by stamping, and cost reductions can be realized.

Figure 57:
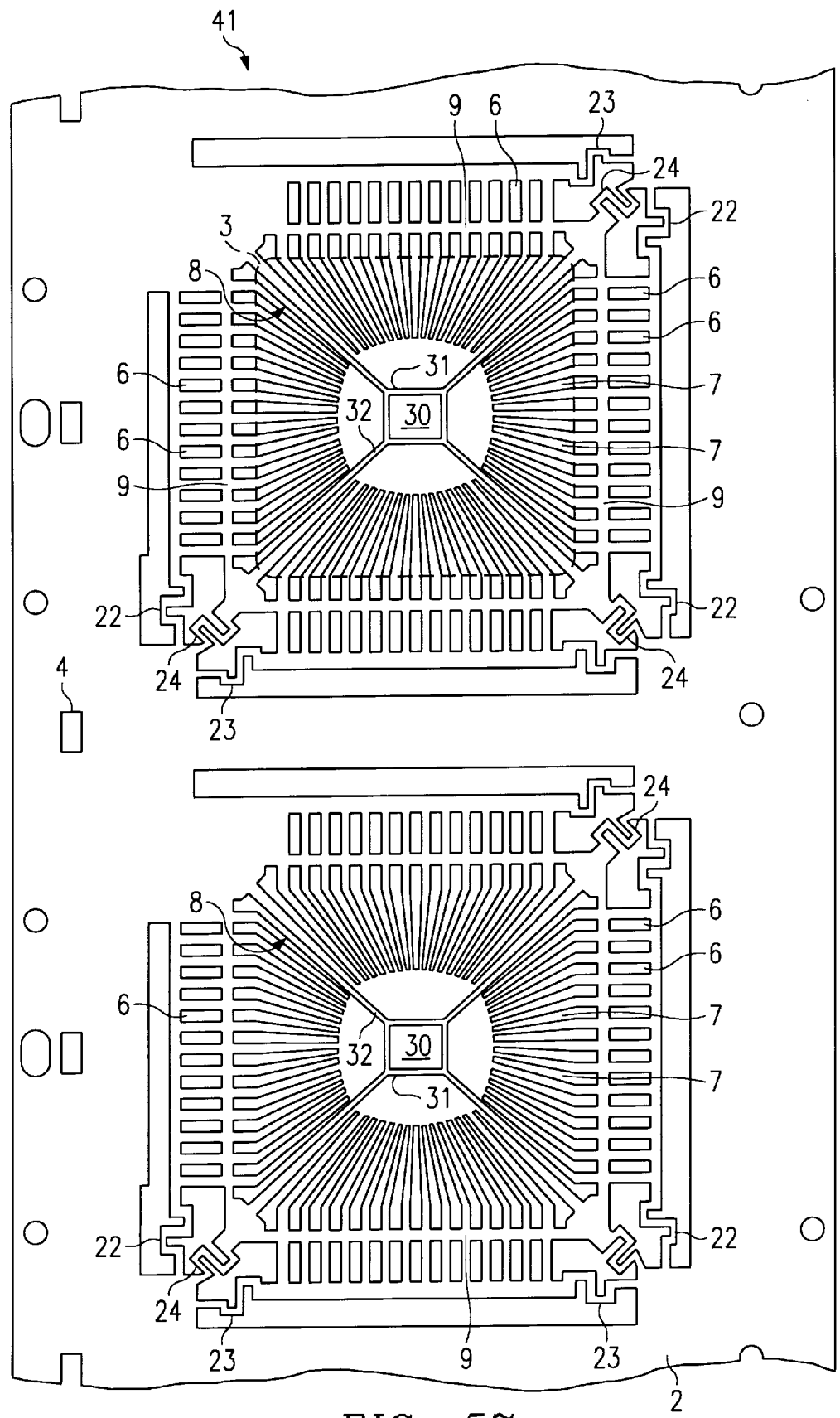
FIG. 57 is a plan view of one portion of the lead frame in the package of FIG. 53.
Figure 60:
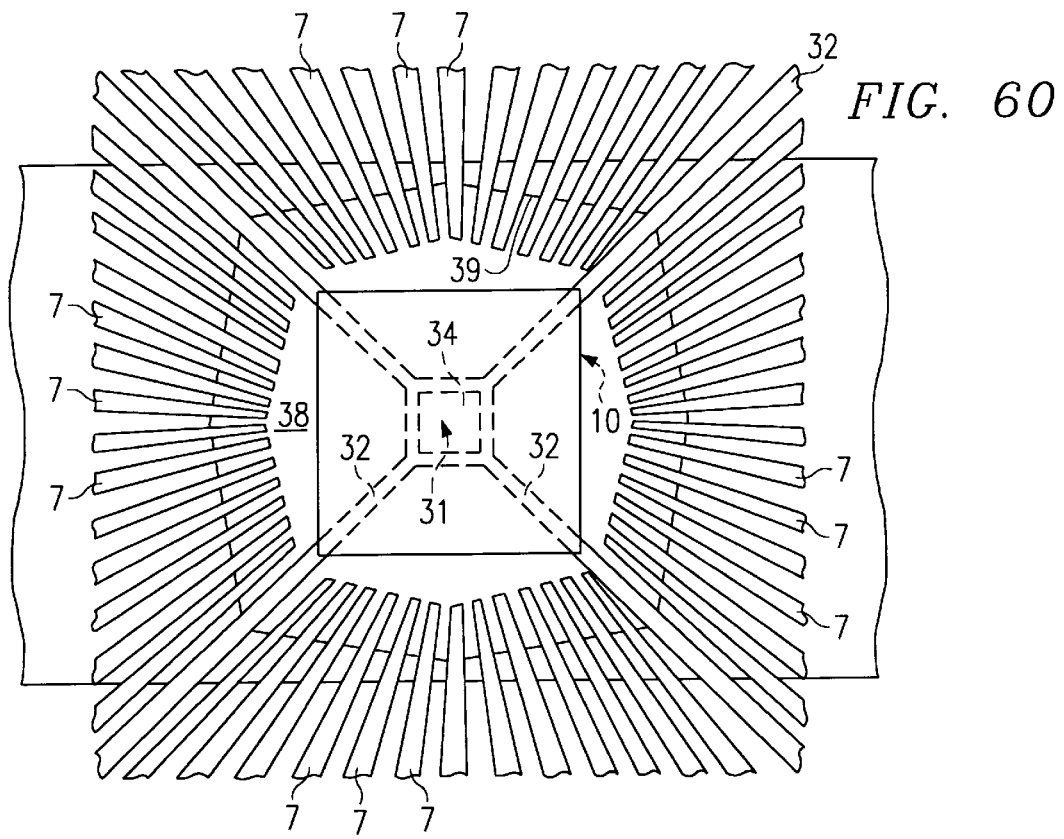
FIG. 60 is a plan view during wire bonding.
Figure 61D:
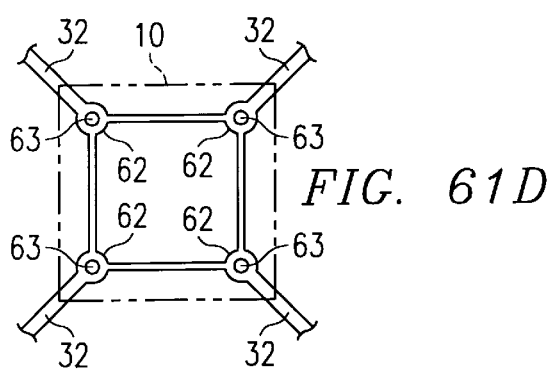
Figure 61E:
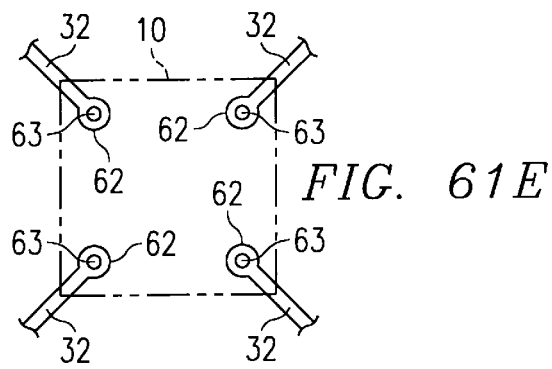
Figure 62A:
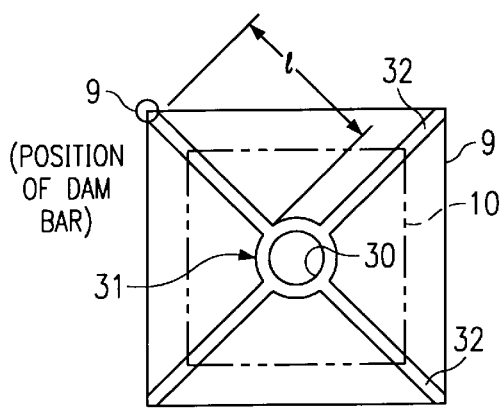
FIG. 62A is a plan view and FIG. 62B is an illustration of the basic principles for the purpose of explaining the floating of a mounting section in the inventions of prior patent application.
Figure 62B:
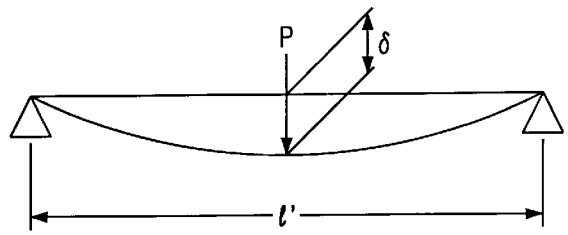

In the lead frame 91, among the four corners of the lead frame section 8, only one corner (in FIG. 5, the upper right corner) is directly affixed to the lead frame outer frame 2 in the same manner as shown in FIG. 57, but the other three corners are respectively connected to the lead frame outer frame 2 by means of snaking bent sections 22,23,24.

With this lead frame 91, even if thermal expansion occurs in lead frame section 8 during a heating process, such as wire bonding, the deformation stress generated in the four directions of up, down, right, and left, are effectively absorbed by the elastic deformation of bent sections 22,23,24. As a result, the dimensional positioning precision (spacing and the like of the leads) of lead frame section 8 itself is improved, and since there is no deformation in the lead frame element itself, its transportability becomes excellent, and smooth transport becomes possible.

Moreover, when resin sealing is done after the IC chip is mounted, even if a force is created that attempts to stretch the leads 6,7 due to the contraction of the resin, this is absorbed by the deformation of bent sections 22,23,24. Because of this, the deformation and deformation of the lead frame element can be prevented, and reliability, such as moisture resistance and the like, is also improved.

The package 83 of FIG. 1 can be manufactured by each of the processes of FIGS. 6–16.

Figure 6A:
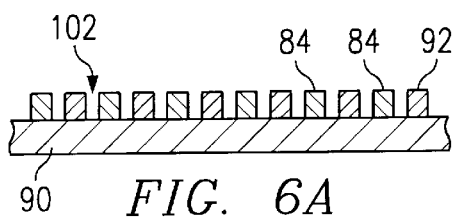
FIGS. 6A and 6B are cross sectional views and FIG. 6C is an oblique view showing one processing step for the manufacturing process of this same package.
Figure 6C:
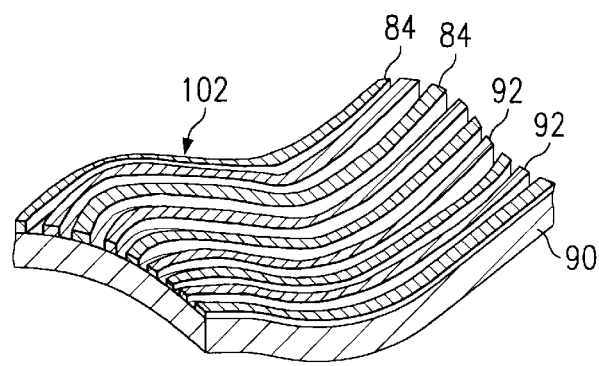
Figure 6B:
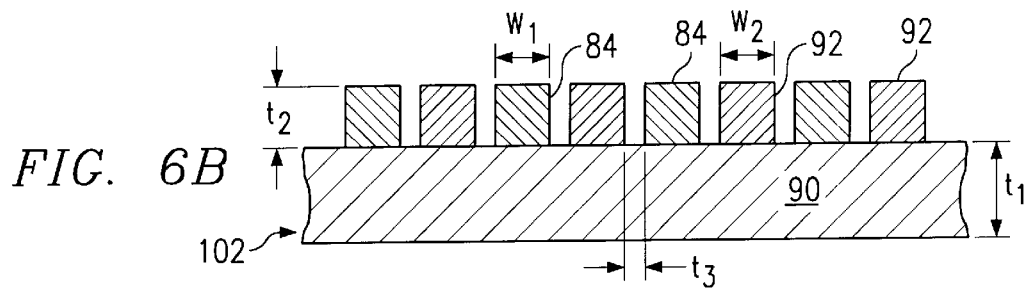
Figure 3:
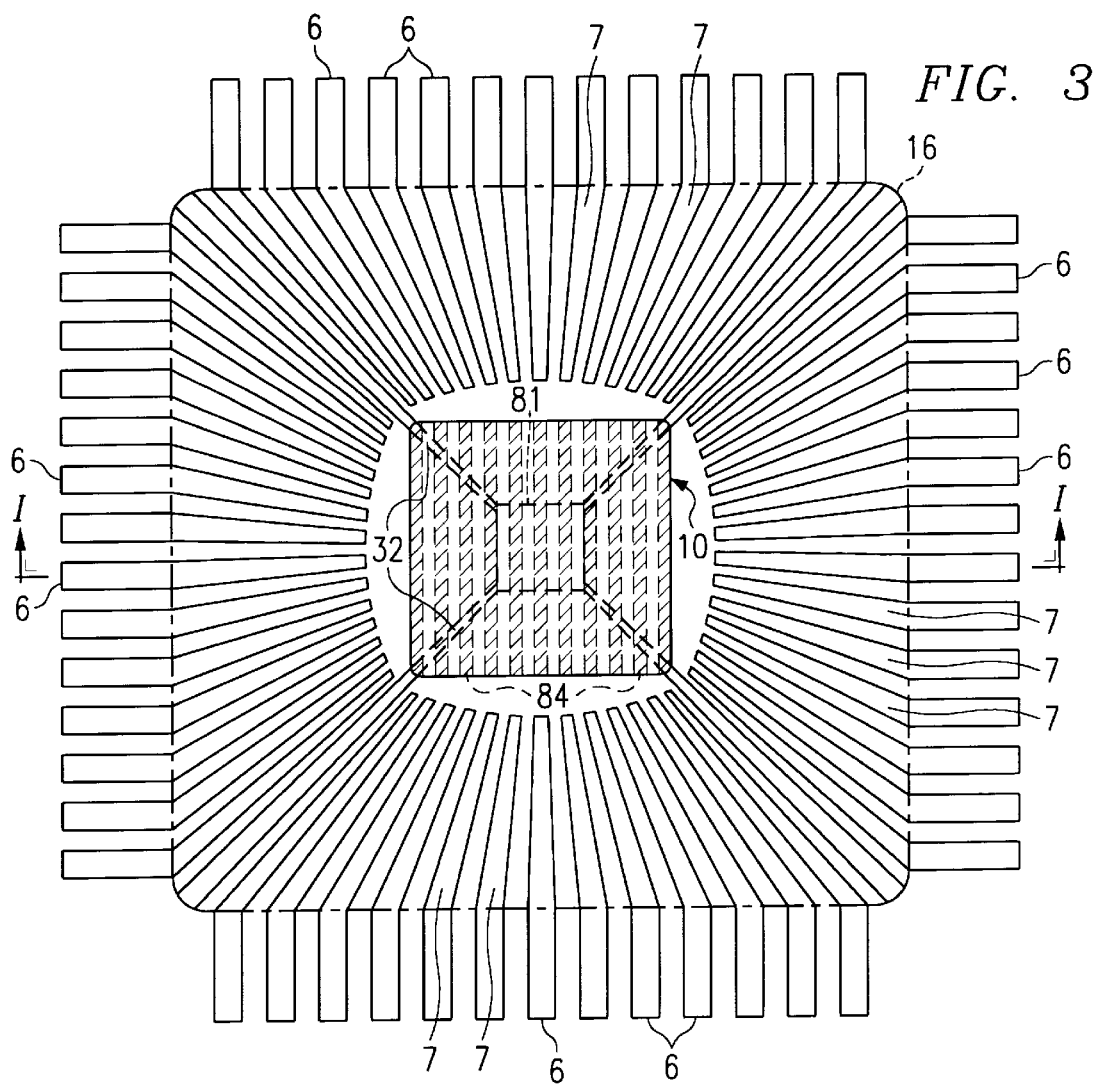
FIG. 3 is a plan view of an IC chip mounted on the lead frame section of this same package.

First, as shown in FIG. 6, the UV curing adhesive 92, which has, as its main component, a resin containing an ultraviolet (UV) curing agent, and thermoplastic polyimide 84, are applied or screen-printed in an alternating striped pattern on top of the tape-shaped heat-resistant base film 90 made of polyethylene terephthalate or the like, forming dicing tape 102.

Ordinarily, the thickness ($t_1$) of the base film 90 is 20–120 μm or greater, the thickness ($t_2$) of the thermoplastic polyimide layer 84 and the UV curing adhesive layer 92 5–30 μm, the width ($w_1$) of the thermoplastic polyimide layer 84 5–500 μm, the width ($w_2$) of the UV curing adhesive layer 92 5–500 μm, and the spacing ($w_3$) between both of these layers 5–500 μm.

Figure 7:
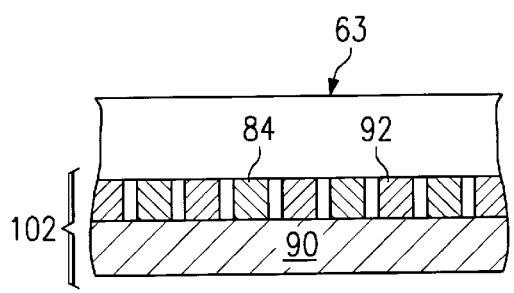
FIG. 7 is a cross section showing another processing step of this same manufacturing process.

As shown in FIG. 7, semiconductor wafer 63 is adhered to dicing tape 102 by means of adhesive layer 92 and polyimide layer 84, particularly by adhesive 92. At this time, since the adhesion temperature is much lower than the glass transition temperature of the polyimide layer 84, this polyimide layer 84 has no adhesion, and only the adhesive layer 92 adheres to the wafer 63. The processes necessary in the manufacture of semiconductor elements, such as the impurity diffusion process, and the insulation coating process have already been done on this semiconductor wafer 63.

Figure 8:
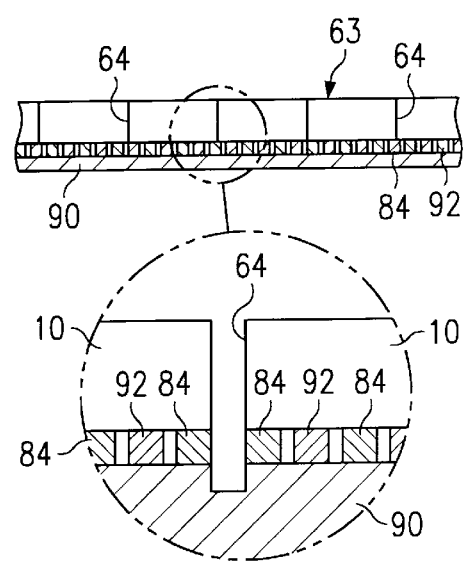
FIG. 8 is a cross section showing another processing step of this same manufacturing process.
Figure 4:
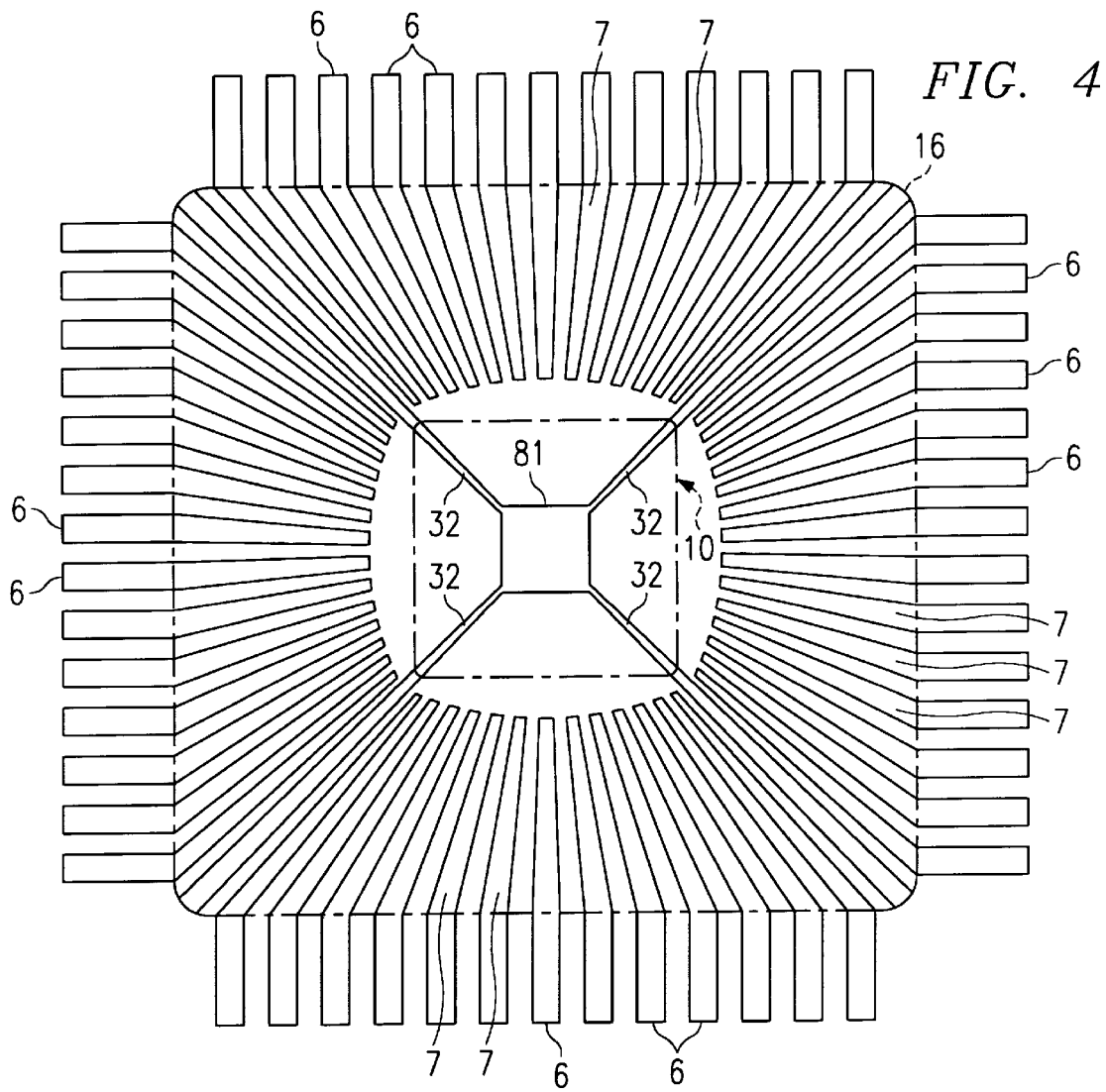
FIG. 4 is a plan view of this same lead frame section.

Next, as shown in FIG. 8, the semiconductor wafer 63 is diced using a dicing saw, and the scribe lines 64 for dividing each semiconductor element (IC chip) 10 are formed. These scribe lines 64 pass through the polyimide layer 84 and the adhesive layer 92 from the semiconductor wafer 63, and extend to the surface of base film 90.

Figures 9, 10:
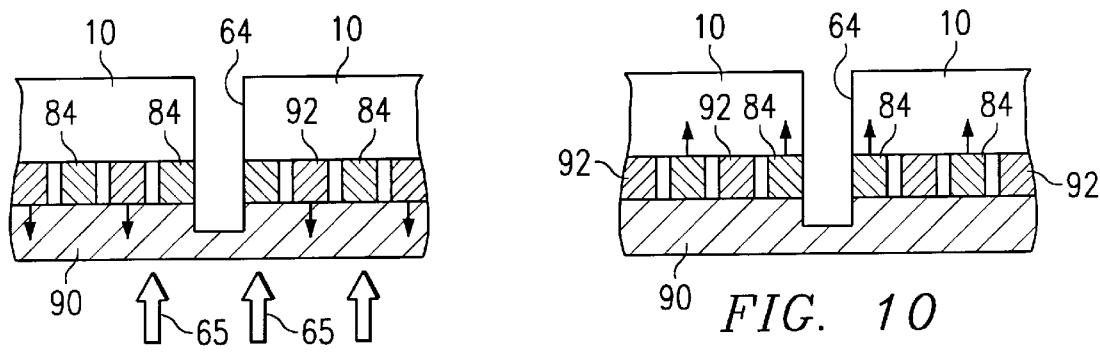
FIG. 9 is a cross section showing another processing step of this same manufacturing process.
FIG. 10 is a cross section showing another processing step of this same manufacturing process.

Next, as shown in FIG. 9, the adhesive 92 is photocured by irradiating ultraviolet rays 65 from the base film 60 side. As a result of this ultraviolet curing, the IC chip 10 and the adhesive 92 can be easily peeled apart (the arrow in the fig. indicates the condition of the appearance).

Next, as shown in FIG. 10, curing (heating) is carried out for 1–2 sec while applying pressure at a temperature of about, for example, 120° C., and as indicated by the arrow, the thermoplastic polyimide 84 is transferred to the back surface of the IC chip 10. This works because, as a result of this curing, the thermoplastic polyimide 84 demonstrates sufficient adhesion to the silicon.

Figure 11A:
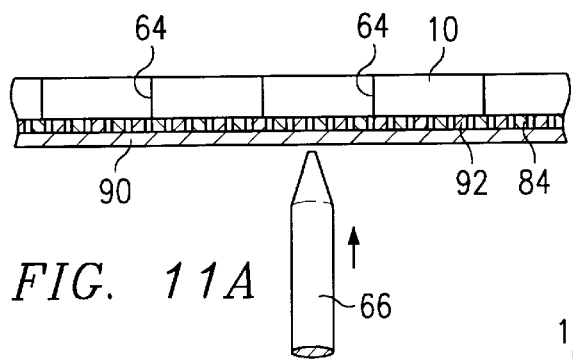
FIGS. 11A–11B are cross sectional views showing another processing step of this same manufacturing process.
Figure 11B:
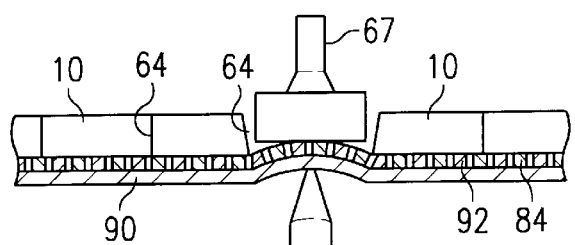

Next, as shown in FIG. 11, ejector pin 66 is pressed or poked up (FIG. 11(A)) from the base film 90 side at the position of each IC chip, the IC chip 10, which becomes the object, is lifted, and the IC chip 10, along with the polyimide 84, are peeled away from the adhesive 92 (base film 90) along the scribe line 64 (FIG. 11(B)).

Figure 12:
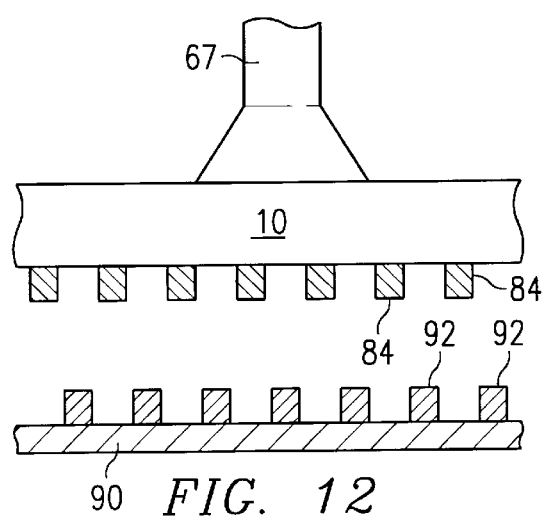
FIG. 12 is a cross section showing another processing step of this same manufacturing process.
Figure 13:
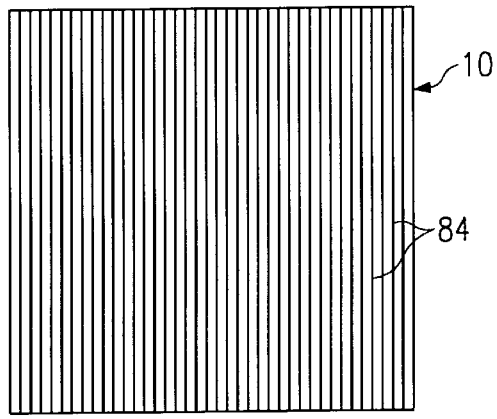
FIG. 13 is a cross section showing another processing step of this same manufacturing process.

Then, the peeled IC chip 10, as shown in FIG. 12, is drawn up by means of vacuum chuck 67, individually separated, and taken away. The thermoplastic polyimide 84 is transferred to the back surface of each IC chip 10 in a striped pattern, as shown in FIG. 13.

Figure 14:
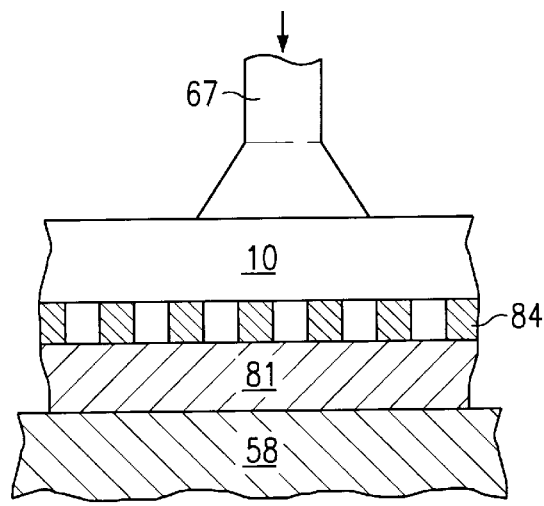
FIG. 14 is a cross section showing another processing step of this same manufacturing process.

Next, as shown in FIG. 14, the back surface of the IC chip 10, which has been drawn up by the vacuum, is adhered on top of the mounting pad 81 by means of thermoplastic polyimide 84. It is heated to, for example, 300° C. with heater block 58, with a force of 2–4 kg for a 1–2 sec interval, the IC chip 10 is heat-pressure bonded on top of mounting pad 81 using thermoplastic polyimide 84.

Next, as shown in FIGS. 15 and 16, the heater element (heater insert) 38, in which provided a rectangular cavity 51 and radiating linear cavities (grooves) 52 are provided for insertion of the mounting pad 81 and support pin 32, is prepared. In FIG. 16, cavities 51,52 are represented by the slanted lines.

Then, as shown in FIG. 15, when the mounting pad 81 and support pin 32 are inserted into each of the cavities 51 and 52 provided in heater element (heater insert or heater block) 38 (see FIG. 60), the back surface of the IC chip 10 comes into contact with the heater element 38 using thermoplastic polyimide 84. At this time, the glass transition temperature of the polyimide 84 is higher than the heater temperature. For example, if the glass transition temperature is equal to the heater temperature +(10–20° C.), the IC chip 10 does not adhere to the heater element 38.

Also, because steps 39 are provided in the surface of the heater element, if the tip sections of the inner leads 7 are pressed by the inner lead clamp 70 (see FIG. 15) at the periphery of the IC chip 10, they come into positive contact with the heater element, and as mentioned previously, stable contact is maintained both thermally and mechanically, and stabile bonding can be carried out.

It is preferable that a spacing of less than about 500 $\mu$m be provided between each cavity 51 and 52 of the heater element, and mounting pad 81 and support pin 32, at the periphery of the IC chip.

In regard to the wire bonding, the wire 15 is supplied to pad 17 using capillary 19, further guided to inner lead 7 as indicated by arrow 20, and pressure bonded while adding heat and ultrasonic wave energy, in the same manner as previously presented.

At this time, even if the mounting pad 81 is made small because it is sufficiently supported on the heater at heater insert 38, wire bonding can be done stably, the heat of the heater directly reaches the IC chip 10 from the heater insert 38, and there is no loss in thermal efficiency.

Through-hole 54 is formed in heater insert 38 as indicated by the broken line, and by providing vacuum suction through this hole, the IC chip 10 can be held to the top of heater insert 38 by suction, and can be stably supported. In addition, the IC chip 10 can be mechanically affixed to the heater insert 38 by means of a clamp (not shown) or the like.

After wire bonding is completed, as shown in FIG. 1, sealing is done using resin 16 according to ordinary methods, the unnecessary portions of outer leads 6 are cut off, and the semiconductor package 83 is manufactured.

The UV curing adhesive 92 used in this embodiment is an adhesive containing an UV curing agent, and specifically, is made of 100 parts by weight of an acrylate group chemical compound (acrylic adhesive) of FIG. 17 wherein polymeric monomers containing acrylic ester and OH radicals are copolymerized, and 50–200 parts by weight of an ultraviolet polymeric chemical compound containing two or more unsaturated bonds, and is a substance wherein, after ultraviolet curing, the modulus of elasticity is greater than $1\times10^9$ dyne/cm$^2$.

In an adhesive made in this manner, in the process of FIG. 9, in the acrylic adhesive wherein polymeric monomers containing acrylic ester and OH radicals are copolymerized, the curing reaction is brought about by reacting with the ultraviolet polymeric chemical compound by means of ultraviolet radiation. This curing reaction brings about volumetric contraction of the acrylic adhesive, and because the close adhesion with the chip is markedly lowered, and if a base film 90, made of polyethylene terephthalate, for example, demonstrating a much greater adhesion than that of chip 10 is used, when the chip is picked up for the mounting process (see FIGS. 11 and 12), the adhesive 92 positively remains on the base film 90.

Also, the thermoplastic polyimide 84, specifically, which can have a constitution like that of FIG. 17, is a polyamide acid group that is obtained by causing a reaction between tetracarboxylic acid dianhydride with a catalyst of N-methyl-2-pyrrolidone, γ-butyrolactone, or the like. Also, in order to increase the wetting of the Si, an epoxy group resin can be added to a 5–30% polyamide group resin. By means of this operation, the wetting can be increased without lowering the glass transition temperature Tg. It is preferable that this polyamide group resin be one wherein the glass transition temperature after thermal curing is above 200° C. The glass transition temperature can be controlled by selecting the mixing ratio of the constitutional components of the polyimide.

In polyamide acid group thermoplastic polyimide, in the process of FIG. 10, the close adhesion with the base film 90 lowers at high temperatures (above 100° C.), but because the adhesion with silicon is much higher than that, it is transferred to the silicon (IC chip 10) side (see FIG. 12).

Next, the actual results wherein the thermoplastic polyimide was transferred to the back surface of the IC chip will be explained.

Namely, the polyamide acid group polyimide resin (glass transition temperature of 210° C.) that was obtained by causing a reaction between tetracarboxylic acid dianhydride with a catalyst of N-methyl-2-pyrrolidone, γ-butyrolactone, or the like was applied on top of a base film, the wafer was peeled off this base film and was transferred to its back surface. In this case, the polyamide acid group polyimide resin was flexographically printed (screen printing is also possible) on top of the base film.

As the base film, items from each of the materials shown below were evaluated:
Polyamide
Polyether imide
Polyether ethyl ketone
Polyallylate
Polyethylene terephthalate Also, in regard to the side of the wafer to which the thermoplastic polyimide was transferred, a sample was used wherein the back surface was polished with a No. 2000 stone. Also, the polyamide acid group polyimide resin, after being printed on the base film, was dried at a temperature of 90° C. with infrared rays for 2–3 sec.

As a result, the following facts were confirmed.

(i) The polyimide base film had a good affinity with the polyamide group polyimide resin, and it was very difficult to transfer this polyimide to the wafer (after heating for 2–3 sec, 120° C.)

(ii) In regard to each of the base films made of polyether imide, polyether ethyl ketone, and polyallylate, because the polyamide acid group polyimide resin was repelled at the surface, printing was difficult.

(iii) The polyethylene terephthalate thermally transferred well (after heating for 2–3 sec at 120° C.) to the back surface of the wafer.

From the results, it is clear that the transfer tape in which the polyamide acid group polyimide resin is printed on a polyethylene terephthalate base film can be used as a mounting material in place of the silver paste used conventionally.

Also, a thermoplastic polyimide was applied to be a dried thickness of 10 μm on top of support elements made of molding resin and silicon, the following measurements were performed based on the 90° peeling test method of ISO regulation 4578-1979, and the adhesion was determined at the boundary between the thermoplastic polyimide and the molding sealing resin, and the thermoplastic polyimide and the silicon chip.

The molding resin used here is a multifunctional epoxy resin, and its physical characteristics are as follows.

Glass transition temperature: 157° C.
Modulus of elasticity: 1580 Kg/mm$^2$
Coefficient of thermal expansion: 9.5 ppm/° C.
Strength: 14.2 kg/mm$^2$ The surface roughness of the silicon chip that was used was measured based on JIS B 0601, using an atomic force microscope. The results were 1618 Å (Rmax), 106 Å (Ra).

Based on the materials and test methods, the results of the 90° peeling for the thermoplastic polyimide film (width 2.5±0.05 cm) are listed below. However, five types of thermoplastic polyimide were used, and their physical properties are of Table I listed below.

TABLE I

| Thermoplastic polyimide resin | | 90° peeling adhesion force (g/cm) | |
|---|---|---|---|
| Glass transition temperature (° C.) | Pyrolysis temperature (° C.) | Boundary between the thermoplastic polyimide and the silicon chip | Boundary between the thermoplastic polyimide and the epoxy resin |
| 180 | 350 | 662 | 960 |
| 228 | 440 | 801 | 1050 |
| 245 | 430 | 202 | 271 |
| 260 | 480 | 405 | 503 |
| 278 | 480 | 102 | 120 |

From the results, it is made clear that the adhesion at the boundary between the thermoplastic polyimide and the epoxy resin is stronger than that at the boundary between the thermoplastic polyimide and the silicon chip. This means that, if the thermoplastic polyimide is used as the mounting material, particularly when mounting an IC chip using a small die pad and a later presented padless lead frame, the adhesion between the IC chip and the molding resin is improved by the presence of the thermoplastic polyimide.

When the UV curing adhesive 92 and the thermoplastic polyimide 84 are provided in a prescribed pattern, for example, a striped pattern, on top of the base film 90, as shown in FIG. 6, it is preferable that the thickness ($t_1$) of the base film 90, the width ($w_1$) and thickness ($t_2$) of the polyimide 84, the width ($w_2$) and thickness ($t_2$) of the adhesive 92, and the spacing ($w_3$) between the polyimide 84 and adhesive 92 be the prescribed dimensions for reasons presented below.

Thickness t, of base film 90:

The thickness is 20–120 μm or more which is sufficiently strong and thick to penetrate ejector pin 66 during the pick-up time of IC chip 10.

Width ($w_1$) of the polyimide 84, width ($w_2$) of the adhesive 92:

It is preferable that these be as small as possible, based on the processing capabilities of painting by means of screen-printing or using a nozzle, and ($w_1$) and ($w_2$) respectively be 5–500 μm, which is the range in which the polyimide 84 and adhesive 92 can be stably applied. However, in order for IC chip 10 to sufficiently contact (adhere) to the mounting section and sufficiently maintain the spacing with the adhesive 92 during mounting; as shown in FIG. 14, it is preferable that the width($w_1$) of polyimide 84 be 20–100 μm. Also, if the spacing between the adhesion of the IC chip 10 during dicing and the polyimide 84 are considered, it is preferable that the width ($w_2$) of the adhesive 92 also be 20–100 μm.

Thickness ($t_2$) of polyimide 84 (adhesive 92):

When mounting the IC chip 10 on the mounting section without any problems at 300° C. in 1–2 sec, the thinner the better, making it 5–30 μm good, and 10–20 μm better.

Spacing $w_3$ of polyimide 84 and adhesive 92:

When adhering wafer 63 to tape 102 (FIG. 7), or when transferring the polyimide 84 at 120° C. (FIG. 10), the spacing ($w_3$) is provided so that the polyimide 84 and the adhesive 92 do not mix together, making 5–500 μm preferable, and 20–100 μm more preferable.

Also, according to the manufacturing method, the thermoplastic adhesive 84 used as the mounting material is provided beforehand on the dicing tape for the semiconductor wafer 63 to be diced into IC chips 10. After it is divided it is transferred along with the IC chip 10 to its back surface, and because a mounting process is offered wherein it is used as is, the adhesive used for mounting and the adhesive used for dicing can be the same, and the process that separately coats the mounting material can be omitted, which is extremely advantageous.

The semiconductor wafer 63 and the dicing tape 102 are adhered (FIG. 7) by intermittently interposing the curing adhesive (UV curing adhesive, which has, as its main component, a resin containing a UV curing agent) 92 along with the thermoplastic adhesive 84, respectively, in a striped pattern; after dicing, the curing adhesive 92 is photocured (FIG. 9), this cured adhesive remains on the dicing tape 102, and the IC chip 10, along with the thermoplastic adhesive 84, can be separated from the dicing tape 102 (FIGS. 10–12).

Therefore, during dicing, the dicing is done with the semiconductor wafer 63 in a state in which it is affixed to the dicing tape 102 using the curing adhesive 92, and after dicing, the curing adhesive 92 is photocured and easily peeled off the IC chip 10. Only the thermoplastic adhesive 84 is transferred to the IC chip 10 side, and can subsequently be sent as is to the mounting process (FIG. 14). Because of this, thermoplastic adhesive 84 is present not only during dicing but also during mounting, and can be used as a mounting material.

During the mounting of IC chip 10, the adhesion is sufficiently brought out by bringing the thermoplastic adhesive 84 to a temperature above the glass transition temperature, and the IC chip 10 can be heat-pressure bonded to the mounting section (FIG. 14).

In this case, in regard to the thermoplastic adhesive 84, which serves as the mounting material, because the IC chip 10 can be heated and heat-pressure bonded to the mounting section by simply conducting thermal processing for an extremely short period of time during the mounting of the IC chip 10, the productivity and process control become extremely simple compared to mounting curing, such as when the previously mentioned silver paste was used.

Also, when bonding the IC chip 10 to the inner leads 7 by wire bonding (FIG. 15), it is preferable that the glass transition temperature of the thermoplastic adhesive 84 be higher than the heater temperature so that the IC chip 10 does not adhere to the heater element 38 through the thermoplastic adhesive 84.

FIG. 18 shows an embodiment wherein the pattern for the polyimide and the adhesive on top of the dicing tape are changed from that in the Embodiment 1.

As shown in FIG. 18(A), when making the dicing tape 124 by screen-printing the UV curing adhesive 112 and the thermoplastic polyimide 114 on top of the base film 90, these are printed alternately or intermittently in a dotted pattern or an array. The polyimide 114 and the adhesive 112 used in this case can be the same material as the polyimide 84 and adhesive 92.

Also, with this type of dotted pattern, as in the case presented in FIGS. 6–14, only the thermoplastic polyimide 114 is transferred in a dot pattern from the dicing tape 124 on the back surface of the IC chip 10, as shown in FIG. 18(B), and the IC chip 10 can be adhered to the mounting section using this as a mounting material.

In this example, because the polyimide 114 and the adhesive 112 provided on dicing tape 124 can be given a dotted pattern, they can be applied in any dispersion and do not even have to be a regular repeating pattern; therefore, screen-printing and painting become simple. In regard to the dotted polyimide 114 and the dotted adhesive 112, the thickness, diameter, and spacing can be equivalent to the case using the striped pattern.

FIG. 19 shows various examples of mounting pads that are different than the mounting pad.

In regard to the example of FIG. 19(a), if the adhesive strength of the IC chip 10 on the mounting pad 81 is temporarily assumed to be insufficient, additional mounting sections 62 are provided with a circular shape on support pins 32, and since the IC chip 10 can be affixed to the mounting pad 81, support pins 32, and furthermore, even on mounting sections 62, the IC chip 10 adhesive strength on top of the lead frame is increased another level. In this case, cavities into which a mounting material is filled are unnecessary in mounting sections 62.

Also, the items of FIGS. 19(b), (c), and (d) are offered, but these are not central section mounting pads, like that of FIG. 19(a). The mounting sections 62 are not limited to having a circular shape, and can take on various shapes, such as triangles, rectangles, other polygons, or ellipses. In FIG. 19(c), connecting pin sections 132 are connected between the mounting pads 62.

In the cases of FIGS. 19(a)–(d), in regard to the additional mounting sections 62, cavity 63 is not provided, as in the mounting section 62 of FIG. 61, and because they are flat, the lead frame manufacturing process can be easily carried out by stamping in order to reduce costs.

In contrast to the example of the FIG. 19(a) wherein support pins 32 respectively connect the corners of the mounting pad 81 (a total of four pins), FIG. 19(e) shows an example wherein the two pins are connected on the diagonal of mounting pad 81. The mounting pad 81 can be sufficiently supported even with two support pins 32 in this manner. The three support pins 32 can also be used, connecting three corners of the mounting pad 81.

The example of FIG. 19(f) is one wherein mounting pad 81 has a shape other than the rectangular shape, for example, a circular shape or a roundness that is close to a circle. By using a pad with a circular shape in this manner, the stress between the resin and mounting pad is diffused, there are cases wherein the stress concentration can be relieved, and there are instances in which the crack resistance is increased. Various pad shapes in addition to those mentioned above can be used, such as other polygonal shapes and curved shapes.

However, when the stability during wire bonding is considered, it is preferable that the IC chip 10 be supported at four corners, and those of FIGS. 19(a)–(d) and (f) are preferable.

In FIG. 20(a), the mounting section 62 in the example of FIG. 19(b) is omitted, and a mounting example wherein the IC chip 10 is supported only by the support pins 32 is shown. In this example, because it has the same construction as an embodiment presented later, it can demonstrate the same operating effects.

FIG. 20(b) shows an example wherein the IC chip 10 is mounted on the inner leads 7 themselves, and is applicable in the COL (chip on lead) type mounting structure.

According to the examples of FIGS. 20(a) and (b), because they are items in which the small die pads 81 and 62 are not used, and the IC chip 10 is mounted on the support pins or the inner leads themselves, the problems that can be created when using the small die pads 81 and 62, in particular, the fact that the chip size is restricted by the position and number of die pads provided, the need to separately manufacture the metal molds for stamping the lead frame and the heater block used for wire bonding and the like depending on the chip size can be eliminated.

FIG. 21 shows an example wherein the structure of FIG. 1 is changed.

A thermoplastic polyimide 84 of the prescribed pattern (for example, a striped pattern) is used as a mounting material, and when manufacturing a package like that of FIG. 1, by controlling the amount of bending (offset amount) (d) of the support pin in relation to lead 7, the position of the mounting pad (small die pad) 81 can be made lower than that of FIG. 1.

In this way, because the thickness ($t_3$) of the molding resin 16 that adheres to the back surface of the IC chip 10 and the thickness ($t_4$) of the molding resin 16 on top of the IC chip 10 can be made the same, the stress generated upward and downward in relation to the IC chip 10 during molding become nearly equal, and the warping of the package due to stress differences, and in turn, the generation of package cracks, can be controlled. In contrast to this, in the case of the conventional example of FIG. 38, because there is a mounting pad 11 that is larger than the IC chip beneath the IC chip 10, it was difficult to make the thickness ($t_3$) of the molding resin 16 beneath the IC chip 10 and the thickness ($t_4'$) of the molding resin 16 on top of the IC chip 10 the same.

Figure 22:
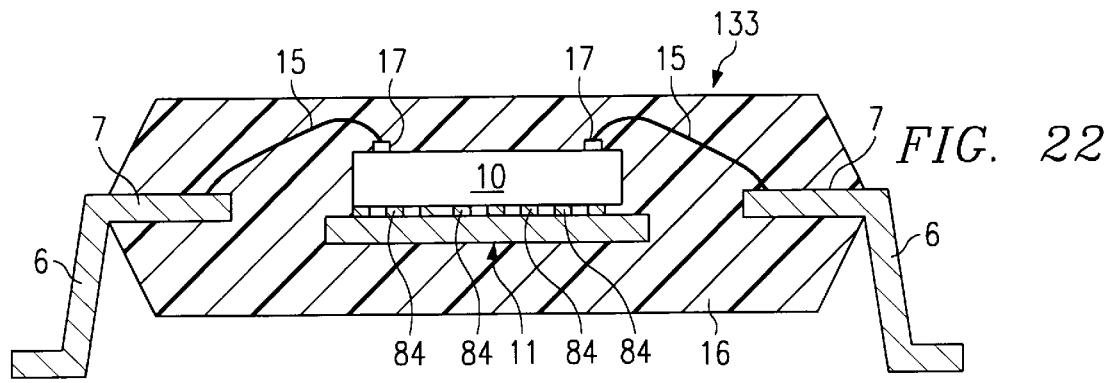
FIG. 22 is a cross section of a semiconductor package (semiconductor device) according to another embodiment of this invention.
Figure 23:
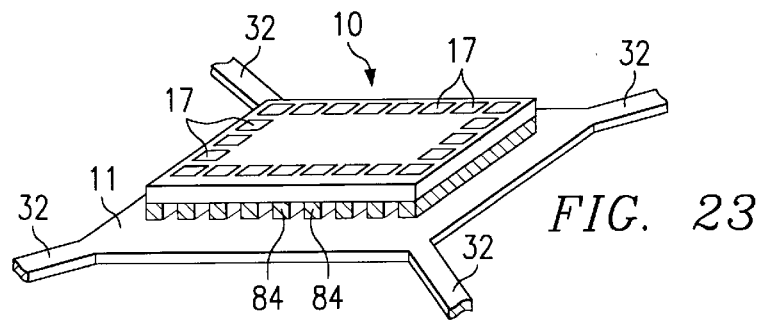
FIG. 23 is an enlarged oblique view of the mounting pad for this same package on which the IC chip is affixed.

FIGS. 22 and 23 show another embodiment of this invention.

The semiconductor package 133 of this example is different from each of the examples in that the mounting sections on which the back surface of the IC chip 10 is affixed using a thermoplastic polyimide 84 provided in a striped pattern is the mounting pad 11 (the size of which is larger than the IC chip 10) of FIGS. 38–42.

Even though this ordinary type of mounting pad 11 is used, since the thermoplastic polyimide 84 can be heat-pressure bonded and used as is as the mounting material since it is transferred from the dicing tape in the same manner as the embodiment examples, mounting can be done without using silver paste, and the same operating effects realized by the devices can be obtained.

FIGS. 24–37 show various other embodiment examples of this invention.

According to the semiconductor package 143 and the lead frame of FIGS. 24–27, compared to the embodiments of FIGS. 1–5, a small die pad 81 and additional pads are omitted (padless), the four support pins 32 are connected at the central section, and vastly differ in that the IC chip 10 is affixed only by these support pins 32 using the thermoplastic polyimide 84 arranged over the entire back surface.

Since the IC chip 10 is directly mounted on the support pins 32, there is no need to provide the mounting pad 11 and small die pads 31,81. With the mounting structure, the support pins are formed as one piece, and a mounting pad or die pad (island) with a sufficient surface area must be added, but this structure allows the IC chip 10 to be mounted only by means of the support pins 32 and eliminates these additional pads, which is possible due to the fact that the thermoplastic adhesive 84 is used as the mounting material, the productivity is good, and the mounting can be done easily. Therefore, this mounting structure, along with offering the operating effects of paragraphs (A), (B), (C), and (D) presented in the embodiment of FIGS. 1–5, also offers the following remarkable operating effects (G)–(L).

(G) In the semiconductor package 143 of this embodiment, since the thermoplastic adhesive 84 arranged on the back surface of the IC chip 10 is applied over the entire back surface of the IC chip 10, the entire area of IC chip 10 is adhered to support pins 32 along its diagonals, but not only is the adhesion for the support pins 32 excellent, because of direct adhesion to the molding resin 16 in the regions at which the support pins 32 are not present, the adhesion of the back surface of the IC chip 10 for the molding resin 16 is also increased another level.

(H) Also, since the thermoplastic polyimide 84 is applied over the entire back surface of the IC chip 10, even if the surface roughness of the back surface of the IC chip 10 varies with each semiconductor wafer or chip, this is alleviated or made uniform by the thermoplastic polyimide 84, and the differences in the surface roughness are reduced. Therefore, no defects caused by varying surface roughness, stable adhesion is realized, crack resistance increases, and package reliability is improved.

(I) The lead frame can be simply manufactured by stamping. At that time, because there is no small die pad or additional mounting section, the metal molds for the pad section can be used for all types of lead frames.

(J) Because the four sections at the four corners of the IC chip 10 are affixed to the support pins 32, the distance between these corners and the dam bar can be made as small as possible, and pad drift can be controlled, which is advantageous.

(K) The reason for attaching the corner of the IC chip as close as possible to the dam bar is because the corners of the IC chip are affixed to the support pins 32 without any additional pads, and because this type of structure uses only the support pins 32 for mounting, mounting can be done in the position of the inner lead section, and it is not subjected to too many limitations.

The heater element (heater block) for wire bonding can be used for all types, regardless of the package size and number of pins. Also, in regard to the size of the chip that can be carried, since there is no die pad, this is restricted only by the wire length.

Here, the support pins 32 have a width of 1.0 mm or less, and are separate from the die pad 81 (this is the same even in the embodiments).

Figure 24:
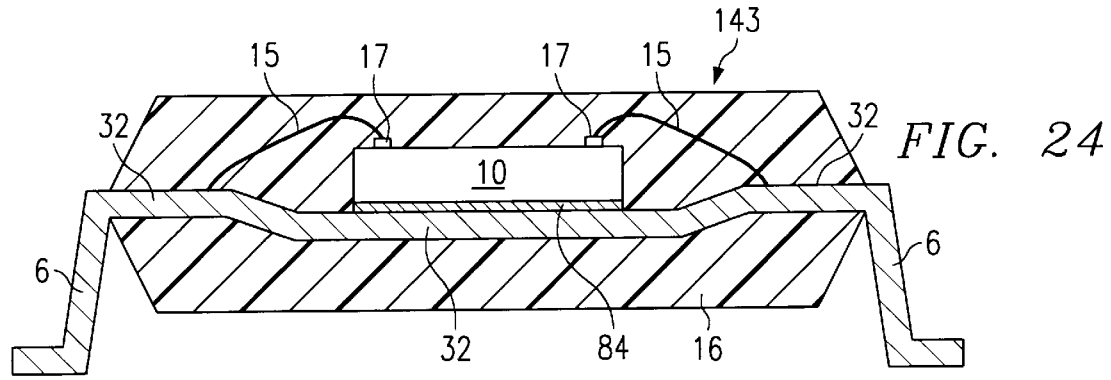
FIG. 24 is a cross section (along line XXIV—XXIV in FIG. 26) of a semiconductor package (semiconductor device) according to another embodiment of this invention.
Figure 25:
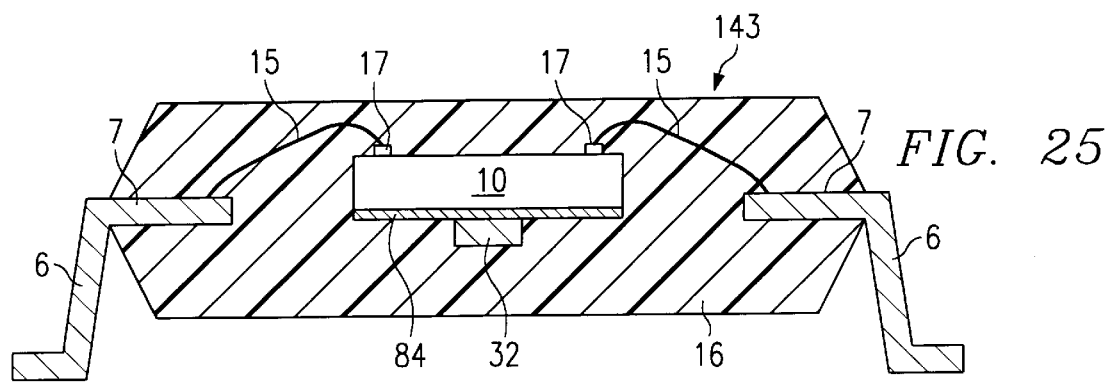
FIG. 25 is a cross section (cross section through line XXV—XXV in FIG. 26) of this same package.
Figure 26:
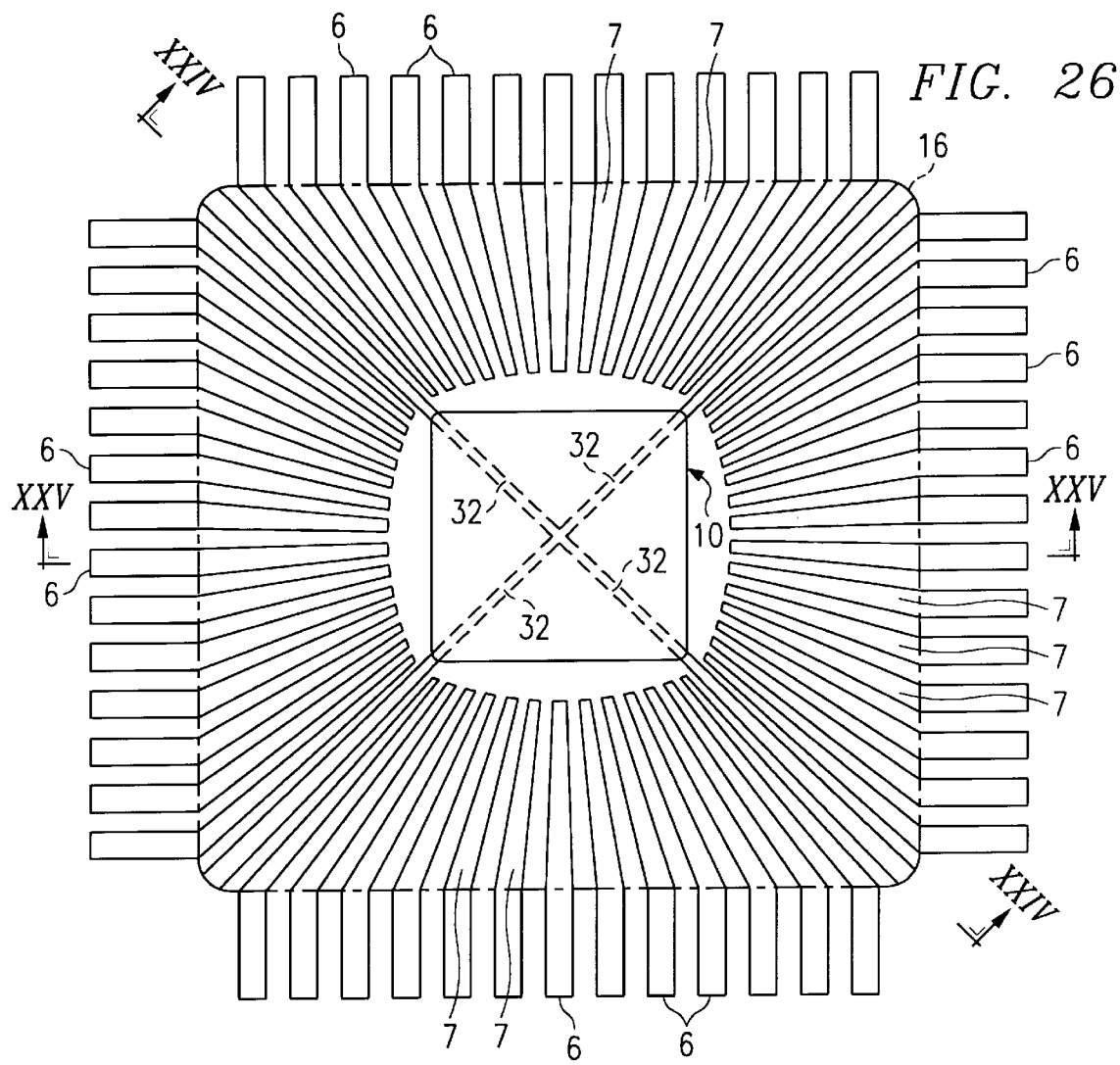
FIG. 26 is a plan view of a configuration wherein the IC chip is mounted on the lead frame section of this same package.

The package 83 of FIGS. 24 and 25 can be manufactured using each of the processes of FIGS. 28–36.

Figure 28A:
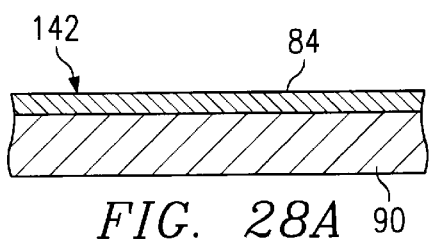
FIG. 28A is a cross section and FIG. 28B is an oblique view showing one processing step for the manufacturing process of this same package.
Figure 28B:
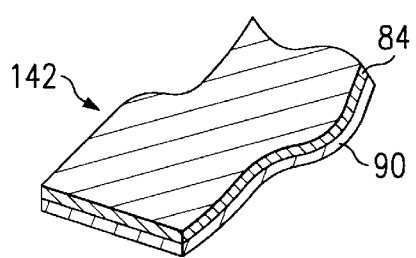

First, as shown in FIG. 28, the thermoplastic polyimide 84 is applied or screen-printed over the entire surface on top of the tape-shaped heat-resistant base film 90 made of polyethylene terephthalate or the like, and the dicing tape 142 is manufactured.

Ordinarily, the thickness of the base film 90 is 50–120 $\mu$m or more and the thickness of the thermoplastic polyimide layer 84 is 5–30 $\mu$m, preferably 10–20 $\mu$m. Also, the thermoplastic polyimide 84 can be the same as that mentioned above.

Figure 29:
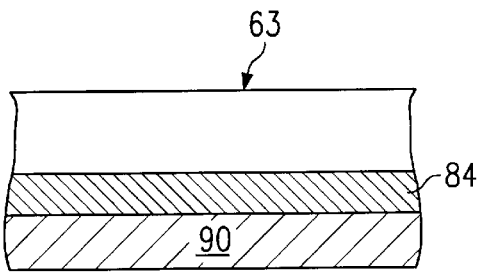
FIG. 29 is a cross section showing another processing step of this same manufacturing process.
Figure 27:
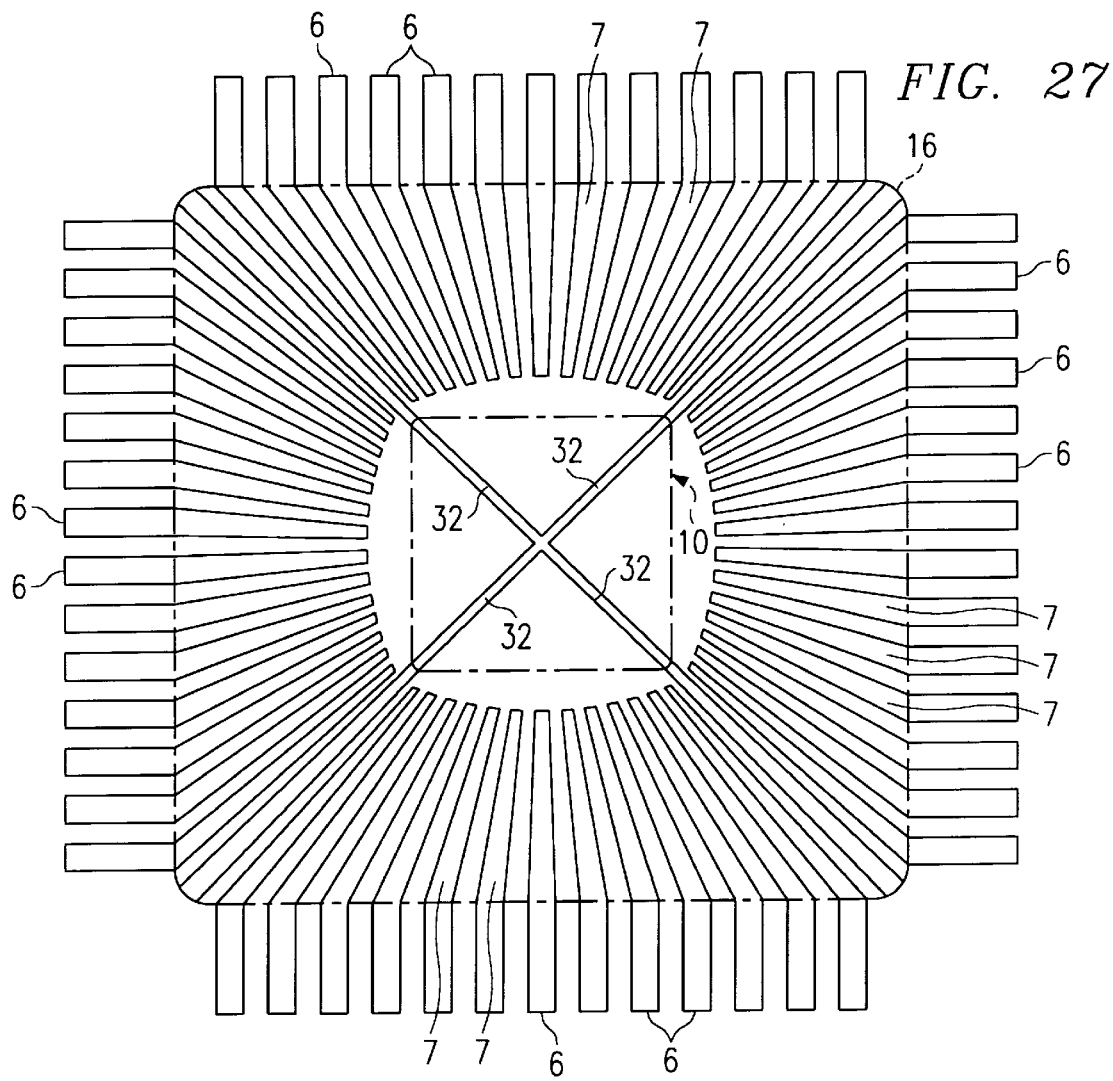
FIG. 27 is a plan view of this same lead frame section.

Next, as shown in FIG. 29, the semiconductor wafer 63 is adhered to the dicing tape 142 using the polyimide layer 84. The processes necessary in the manufacture of semiconductor elements, such as the impurity diffusion process and the insulation coating process, have already been done on this semiconductor wafer 63.

Figure 30:
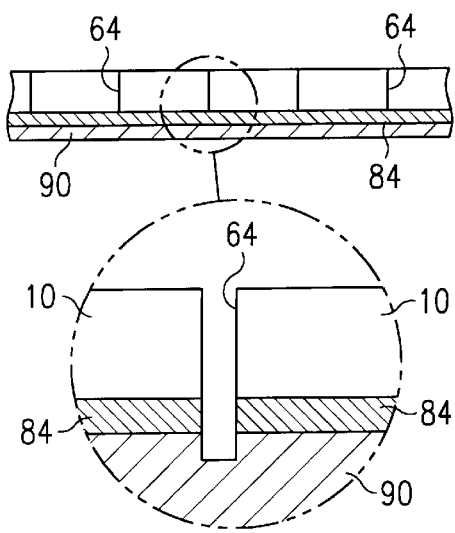
FIG. 30 is a cross section showing another processing step of this same manufacturing process.

Next, as shown in FIG. 30, the semiconductor wafer 63 is diced using a dicing saw, and the scribe lines 64 for dividing each semiconductor element (IC chip) 10 are formed. These scribe lines 64 pass from the semiconductor wafer 63 through the polyimide layer 84, and extend to the surface of the base film 90.

Figure 31:
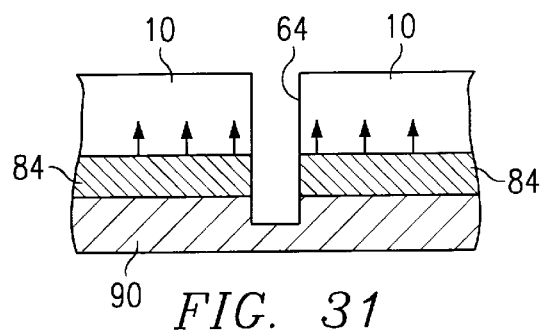
FIG. 31 is a cross section showing another processing step of this same manufacturing process.

Next, as shown in FIG. 31, curing (heating) is carried out for 1–2 sec at, for example, 120° C., and the thermoplastic polyimide 84 is transferred to the back surface of the IC chip 10 as indicated by the arrows. This occurs because, as a result of the curing, the thermoplastic polyimide 84 shows sufficient adhesion with silicon.

Figure 32A:
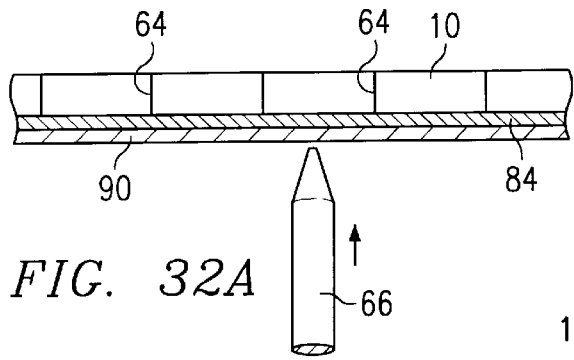
FIGS. 32A–B are cross sectional views showing another processing step of this same manufacturing process.
Figure 32B:
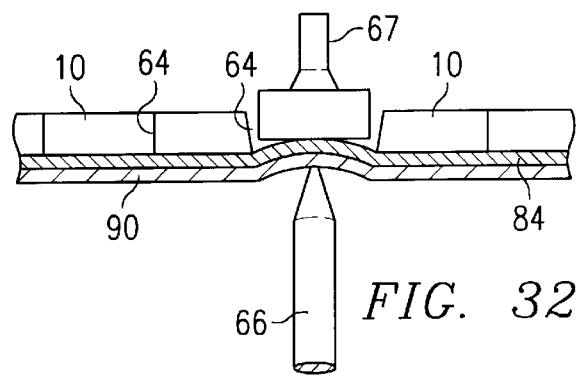

Next, as shown in FIG. 32, the ejector pin 66 pushes or pokes up (FIG. 32(A)) from the base film 90 side at the position of each IC chip 10, the IC chip 10, which has become the object, is lifted, and the IC chip 10, along with the thermoplastic polyimide 84, is peeled off the base film 90 along the scribe line 64 (FIG. 32(B)).

Figure 33:
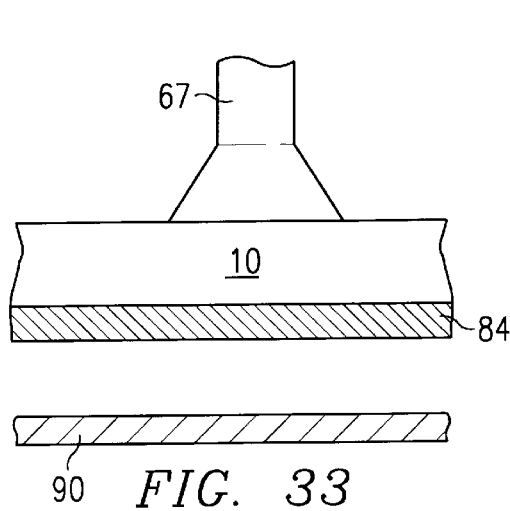
FIG. 33 is a cross section showing another processing step of this same manufacturing process.

Then, as shown in FIG. 33, the peeled IC chip 10 is drawn up by means of the vacuum chuck 67, individually separated, and taken away. The thermoplastic polyimide 84 is transferred uniformly over the entire back surface of each IC chip 10.

Figure 34:
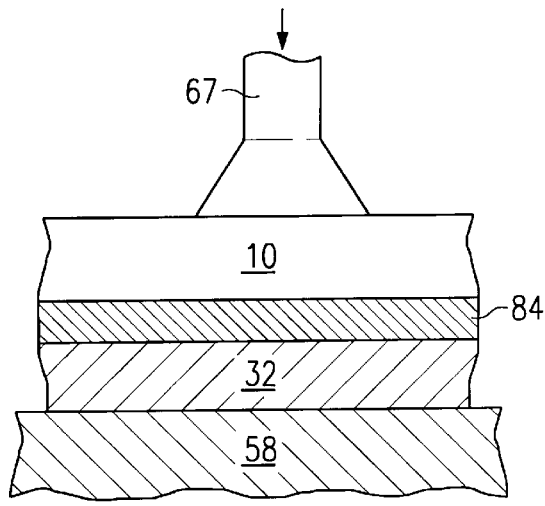
FIG. 34 is a cross section showing another processing step of this same manufacturing process.

Next, as shown in FIG. 34, the back surface of the vacuum drawn IC chip 10 is adhered to top of the support pins 32 using the thermoplastic polyimide 84. It is heated with heater block 58, for example, to above 300° C. for 1 sec, and the IC chip 10 is thermally bonded on top of support pins 32 using thermoplastic polyimide 84 under a force of 2–4 kg.

Figure 35:
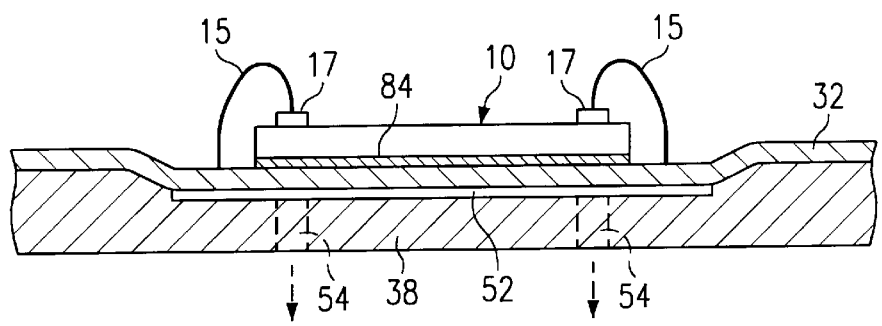
FIG. 35 is a cross section showing another processing step of this same manufacturing process.
Figure 36A:
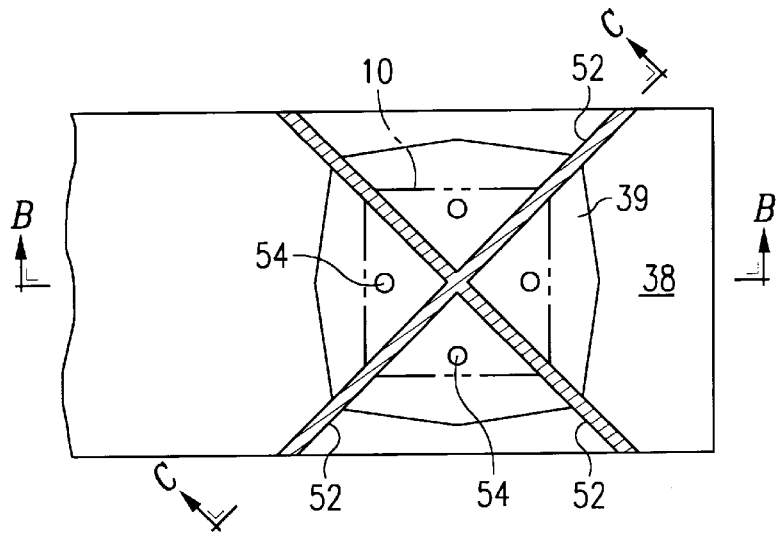
FIG. 36A is a plan view, FIG. 36B a cross section along lines B—B
Figure 36B:
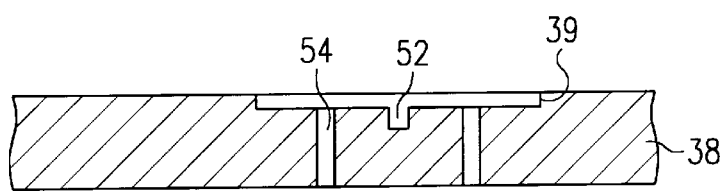
FIG. 36 is a cross section along line C—C of the a processing step of FIG. 35.
Figure 36C:
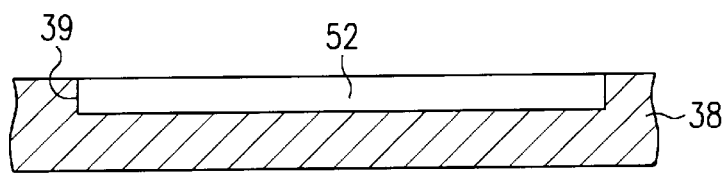

Next, as shown in FIGS. 35 and 36, the heater element (heater insert) 38 that provides the radiating linear cavities (grooves) 52 for the insertion of support pins 32 is prepared. In FIG. 36, cavities 52 are shaded.

Then, as shown in FIG. 35, when the support pins 32 are inserted into each of the cavities 52 provided in the heater element (heater insert or heater block) 38 (see FIG. 60), the back surface of the IC chip 10 comes into contact with the heater element 38 through the thermoplastic polyimide 84. At this time, if the glass transition temperature of the polyimide 84 is higher than the heater temperature, for example, the heater temperature +(10–20° C.), the IC chip 10 does not adhere to the heater element 38.

In regard to the wire bonding, in the same manner as previously presented, while applying heat and ultrasonic wave energy, wire 15 is bonded to the pad 17 using the capillary 19, is further guided to the inner lead 7, and is pressure bonded.

At this time, because the support pins 32 are sufficiently supported on the heater insert 38, wire bonding can be stably done, the heat from the heater can be directly propagated from the heater insert 38 to the IC chip 10, and there is no loss in thermal efficiency.

Through-holes 54, like those indicated by the broken lines, are formed in heater insert 38, and IC chip 10 is drawn on top of the heater insert 38 by means of vacuum suction through these through-holes, and it can be stably supported. In addition, the IC chip 10 can be mechanically affixed to the heater insert 38 by means of a clamp (not shown) or the like.

After the completion of wire bonding, it is sealed using resin 16 as shown in FIGS. 24 and 25 according to ordinary methods, the unnecessary portions of outer leads 6 are cut off, and the semiconductor package 143 is manufactured.

According to the manufacturing method, the thermoplastic adhesive 84 that adheres and holds the semiconductor wafer 63 on dicing tape 142 during dicing is transferred to the IC chip 10 side after dicing, and it can be sent to the subsequent mounting process (FIG. 34) as is. Because of this, the thermoplastic adhesive 84 is present not only during dicing, but also during mounting, and can be used as a mounting material.

During mounting of the IC chip 10, the adhesion is sufficiently brought out by heating to a temperature above the glass transition temperature of the thermoplastic adhesive 84, and the IC chip 10 is heat-pressure bonded to the mounting section (FIG. 34).

In this case, because the thermoplastic adhesive 84, which acts as the mounting material, can heat-pressure bond the IC chip 10 to the mounting section just by thermally processing for an extremely short period of time during the mounting of the IC chip 10, the productivity and the process control becomes extremely easy compared to the mounting curing, such as when the previously mentioned silver paste was used.

Also, it is preferable that the glass transition temperature of the thermoplastic adhesive 84 be made higher than the heater temperature so that the IC chip 10 does not adhere to the heater element 38 through the thermoplastic adhesive 84 when bonding the IC chip 10 to the inner leads 7 by wire bonding (FIG. 35).

Next, in this embodiment, the performance evaluation of the thermoplastic polyimide in this embodiment was made as follows, and the results are explained below.
Evaluated sample:
Lead frame: copper frame, thickness 0.127 mm, support pin width 0.2 mm
Package: 14×14 mm, 1.0T, 100 PIN, TQFP
Molded compound: biphenyl type
IC chip: 9×9 mm, thickness 280 $\mu$m
Mounting characteristics:
The configurations for mounting the IC chip were evaluated using the following standards, and the results are of the following Table II.
O Adhered to the entire body of the support pin at 300° C., 1 sec
Δ A portion of the support pin peeled at 300° C., 1 sec
X Did not adhere to the support pin at 300° C., 1 sec

TABLE II

| Thermoplastic polyimide | Glass transition temperature Tg (° C.) | Polyimide thickness | | |
|---|---|---|---|---|
| | | 5 $\mu$m | 10 $\mu$m | 15 $\mu$m |
| No. 1 | 206 | Δ | O | O |
| No. 2 | 240 | Δ | Δ | O |
| No. 3 | 282 | X | Δ | Δ |

Crack resistance:
The crack resistance was evaluated for all of the samples after conducting VPS (vapor phase soldering: vapor soldering) three times at 215° C. after processing at 85° C./85% RH, for 168 h, and the results are of the following Table III.

TABLE III

| Thermoplastic polyimide | Glass transition temp. Tg (° C.) | Polyimide thickness | | |
|---|---|---|---|---|
| | | 5 $\mu$m | 10 $\mu$m | 15 $\mu$m |
| No. 1 | 206 | NA* | NA* | 7/12 (internal)** |
| No. 2 | 240 | NA* | NA* | 0/10 |
| No. 3 | 282 | NA* | NA* | 0/3 |

*NA: not evaluated
**Number of chips in which a crack was generated/number of samples (chip peeling was 50–100%)

In the tests, the following points were included in the evaluation.
Polyimide thickness:
When the polyamide was thin, bonding became difficult, and the polyimide thickness was increased in moderation until bonding was possible. When the polyamide was thick, because the crack resistance became poor, the thickness was decreased until it could pass the standard test.
Glass transition temperature (Tg):
A glass transition temperature that was as low as possible and pass the standard test was used. When the Tg becomes low, the crack resistance becomes poor, but because a lead frame made of copper is used, a high Tg is not desirable.

Thus, the following facts can be understood from the results.

1) From Table I, it can be seen that it is necessary that the thickness of the polyimide be 15 $\mu$m or more.

2) About 240° C. is believed to be an appropriate Tg. From Table III, it can be seen that with a Tg of 206° C., the crack resistance posed a problem, and at 282° C., mounting was difficult (heater temperature 300° C.). It is necessary to consider the crack resistance and the mounting properties when selecting the Tg, and it is preferable to set it within a range of 210–250° C.

3) From Table III, it can be seen that a polyimide with a Tg above 240° C. passes the reference test.

FIG. 37 shows various examples of different support pins, along with the support pin.

Figure 37A:
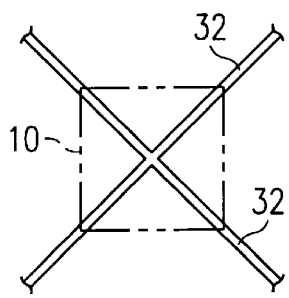
FIGS. 37A–G are plan views of the essential components of a lead frame according to yet another embodiment of this invention.
Figure 37B:
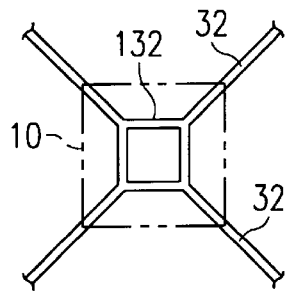

FIG. 37(a) shows the support pin, but FIG. 37(b) is one wherein an additional support pin section 132 (connected pin section) with a rectangular frame is provided as one piece at the intersection of the support pins 32.

Figure 37C:
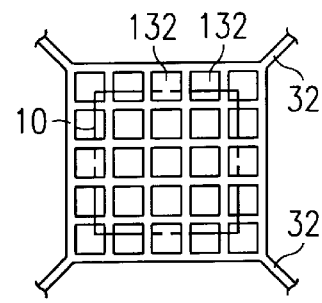
Figure 37D:
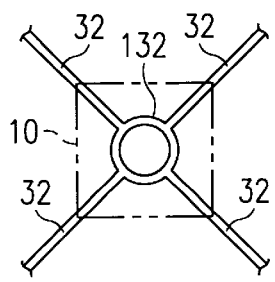
Figure 37E:
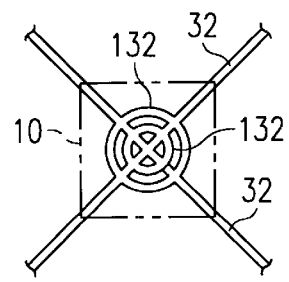
Figure 37F:
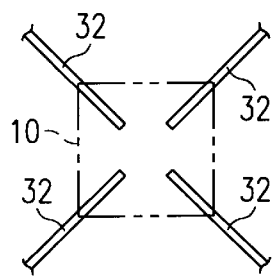

FIG. 37(c) shows an example wherein this type of a support pin section 132 is made up of a large number of pins in a lattice pattern, and wherein the heat radiation effect of the IC chip 10 is considered. FIG. 37(d) shows an example that is a variation of FIG. 37(b) and the support pin section 132 is circular. FIG. 37(e) shows an example wherein the support pin section 132 has a concentric circular form, and FIG. 37(f) shows an example wherein four support pins 32 are separated at the center and are made mutually independent.

Figure 37G:
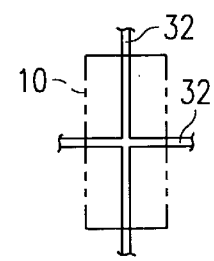
Figure 38:
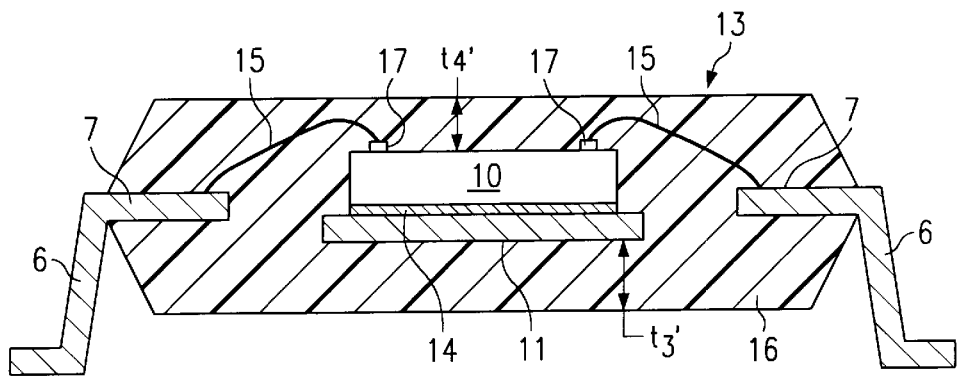
FIG. 38 is a cross section of a conventional semiconductor package.
Figure 39:
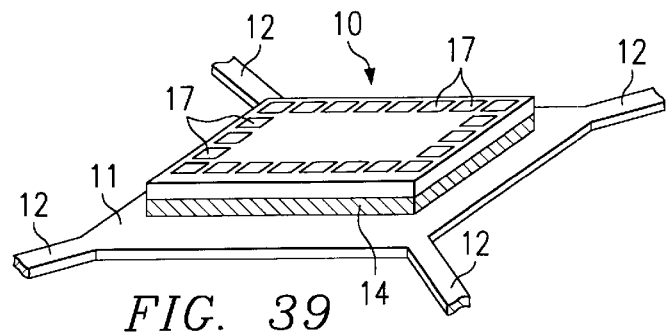
FIG. 39 is an enlarged perspective of a conventional mounting pad to which an an IC chip is affixed in the package of FIG. 38.
Figure 40:
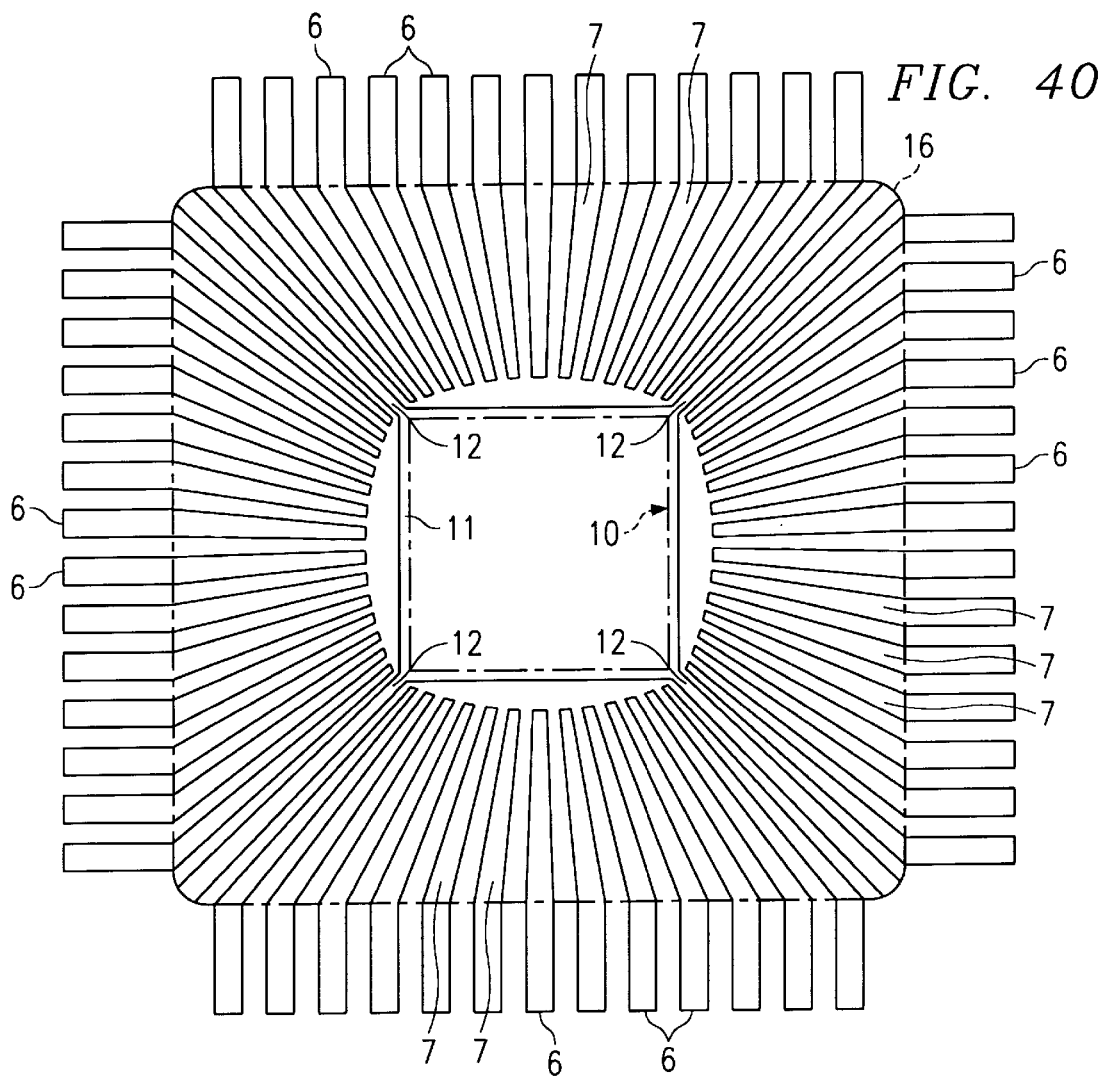
FIG. 40 is a plan view of an IC chip affixed to the mounting pad of FIG. 39 for connection to a lead frame.
Figure 42:
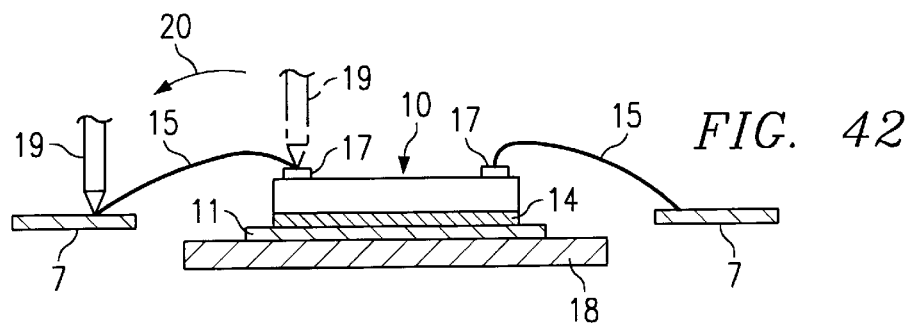
FIG. 42 is a cross section of the essential components during wire bonding.
Figure 43:
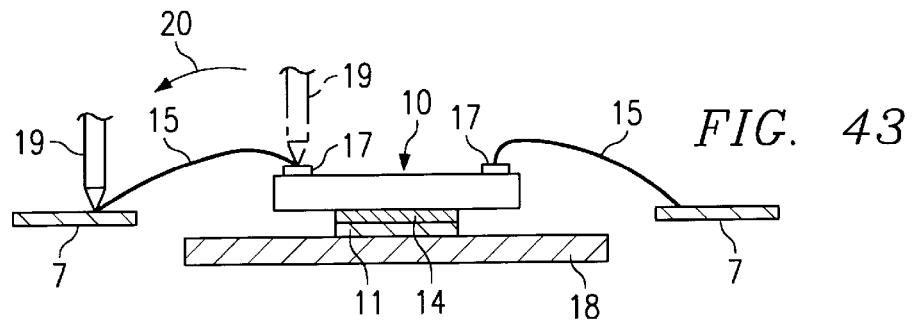
FIG. 43 is a cross section of the essentials components during wire bonding using another version of the mounting pad.
Figure 41:
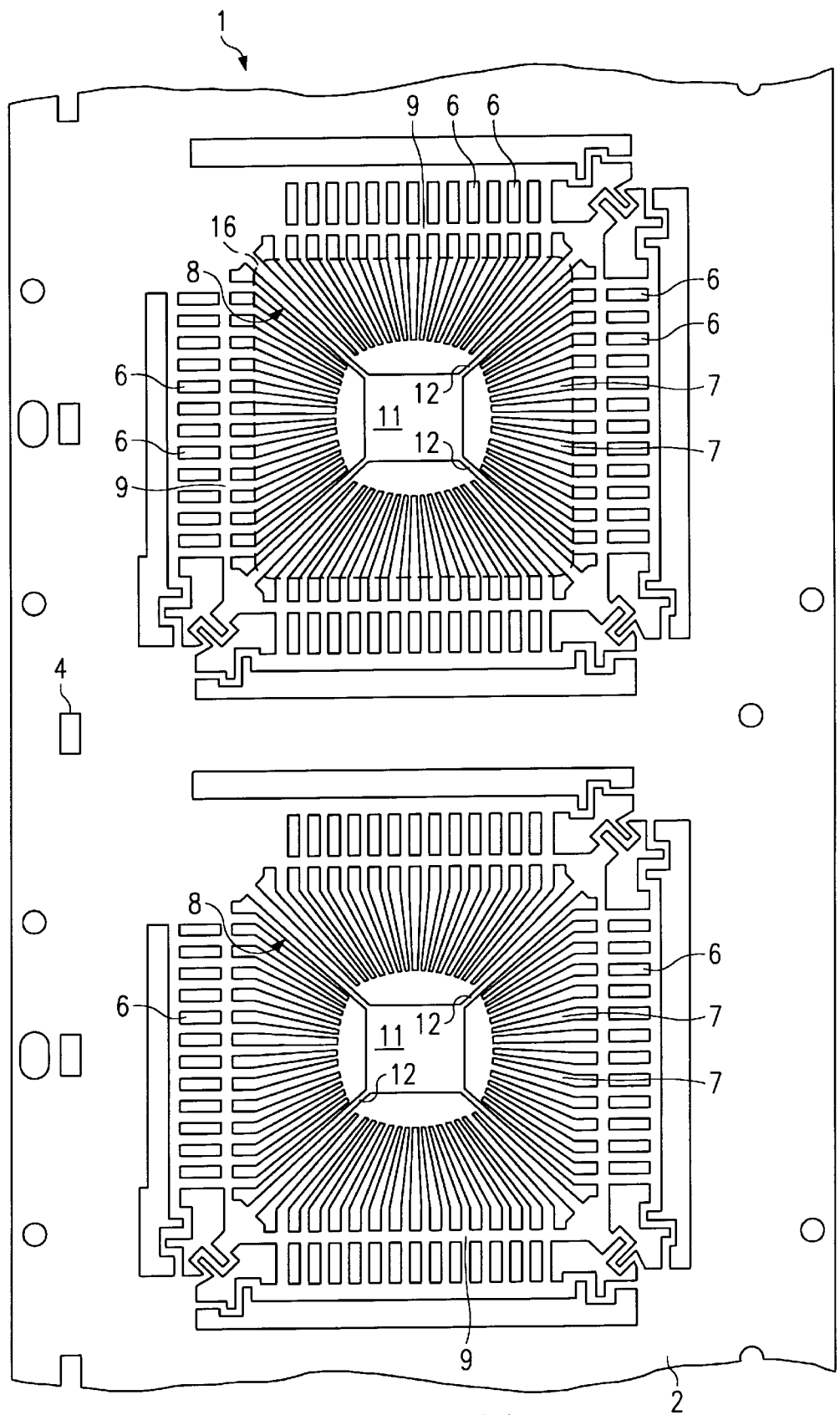
FIG. 41 is a plan view of the lead frame.
Figure 44:
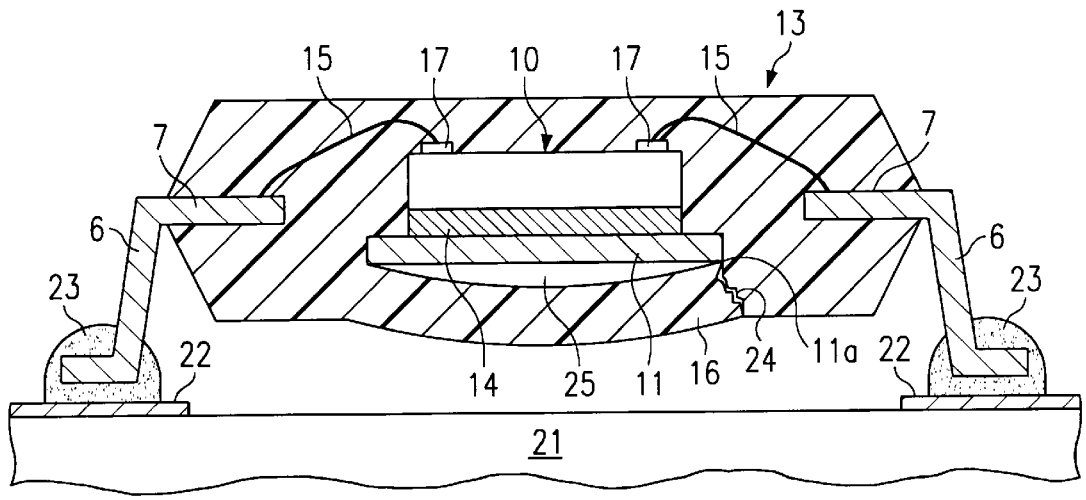
FIG. 44 is a cross section during solder reflow of a semiconductor package.
Figure 45:
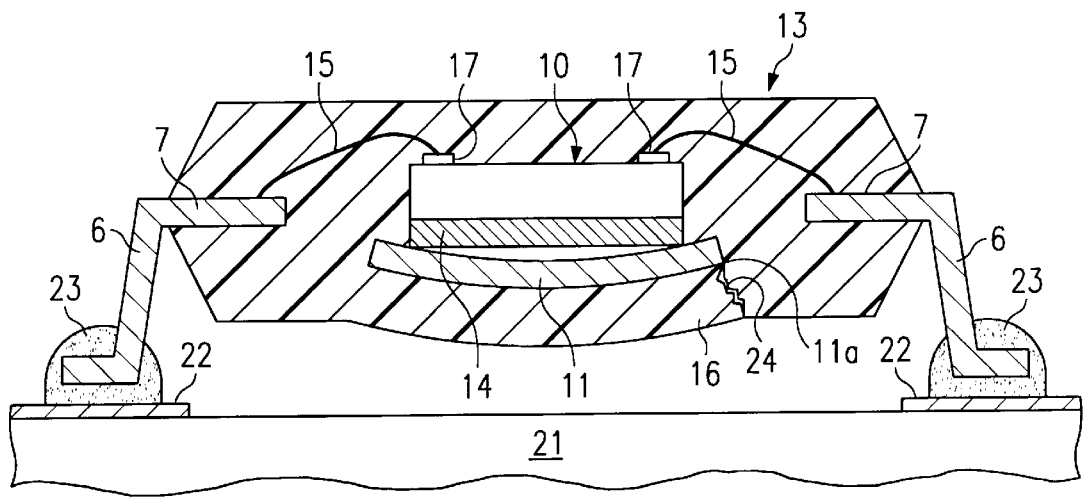
FIG. 45 is a cross section during solder reflow of a semiconductor package.
Figure 46A:
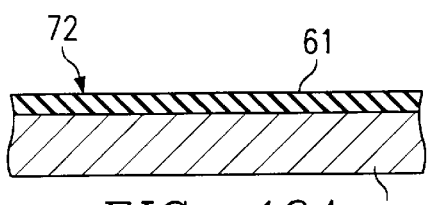
FIG. 46A is a cross section and FIG. 46B is an oblique view showing one processing step of a manufacturing process for this same package.
Figure 47:
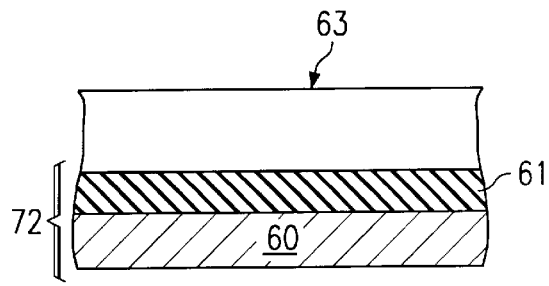
Figure 46B:
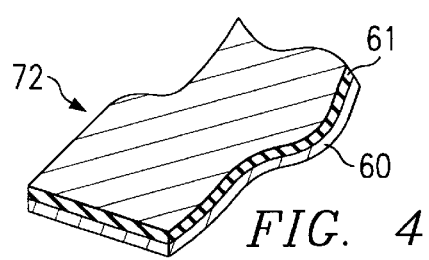
Figure 53:
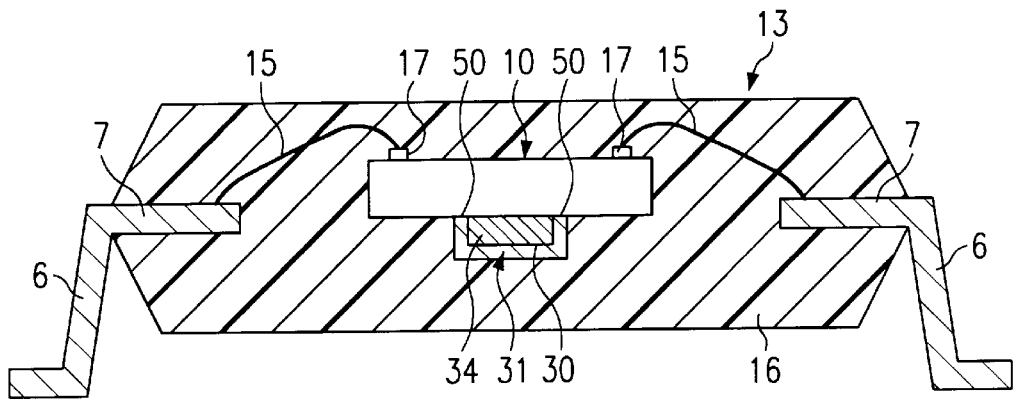
FIG. 53 is a cross section of a semiconductor package according disclosed in a prior patent application.
Figure 54:
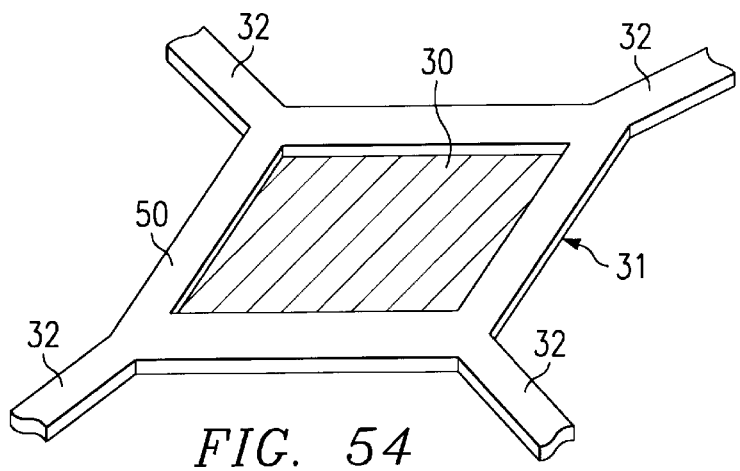
FIG. 54 is an enlarged perspective view of a lead frame portion of the package of FIG. 53.
Figure 55:
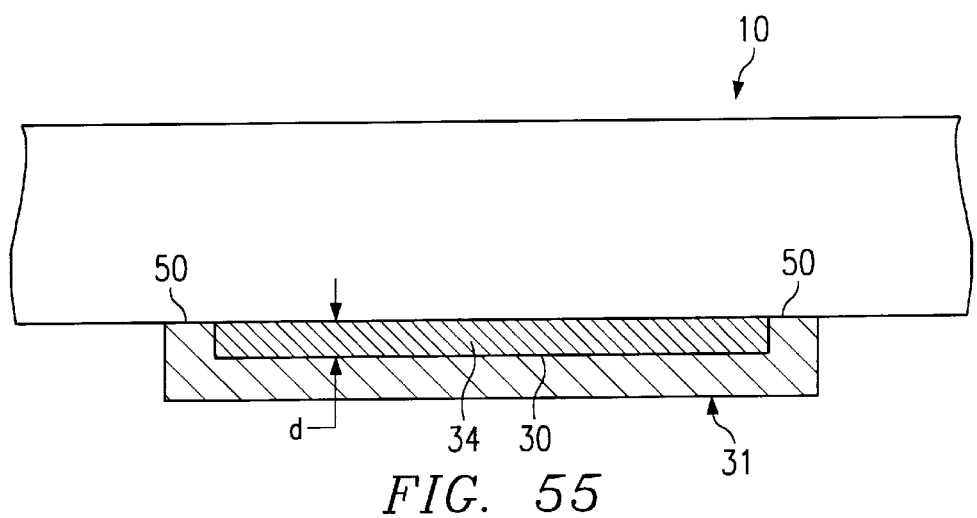
FIG. 55 is an enlarged view of the main components of the semiconductor package of FIG. 53.
Figure 56:
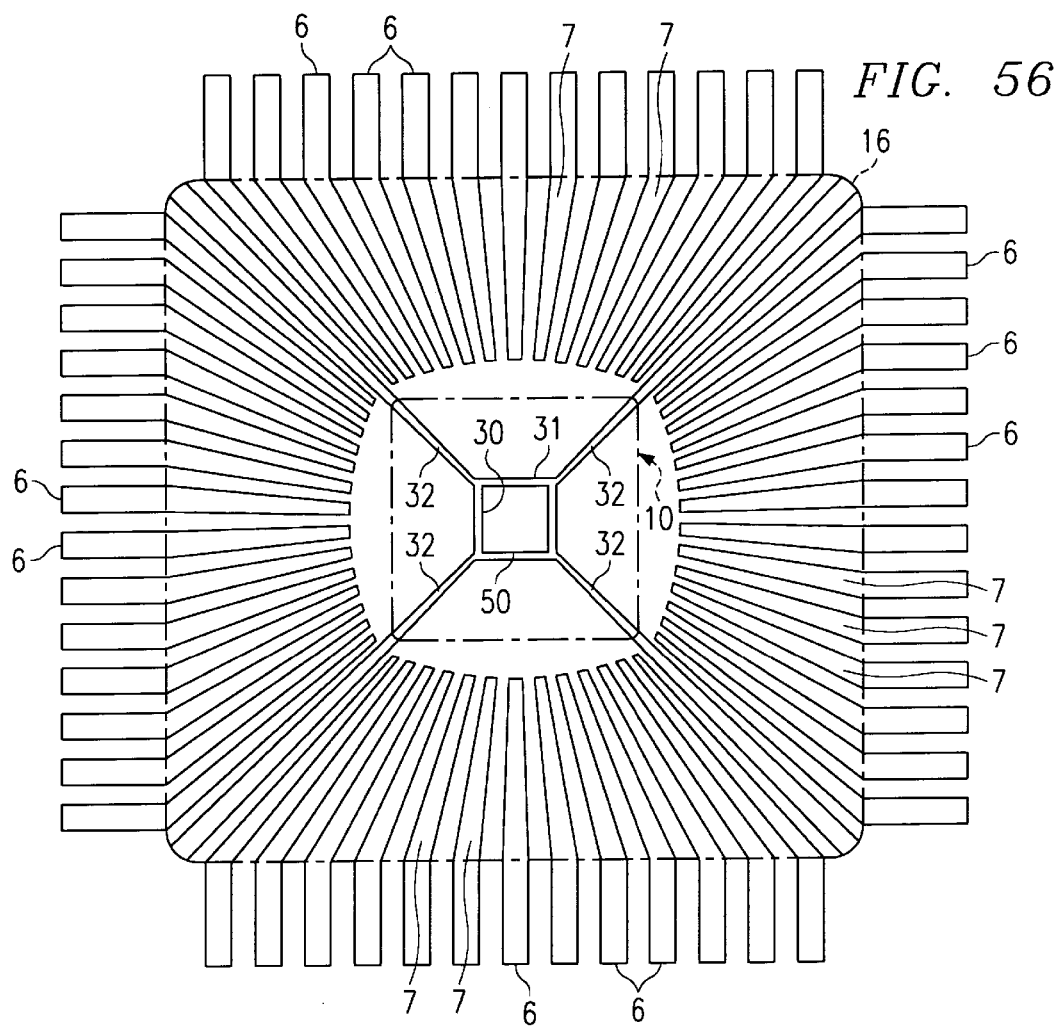
FIG. 56 is a plan view of the package of FIG. 53.
Figure 61A:
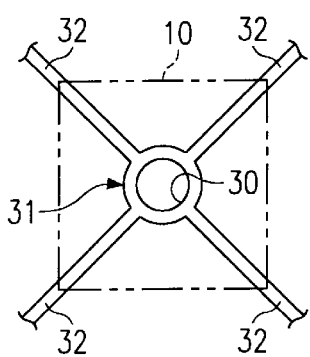
FIGS. 61A–E are plan views of the main components of another lead frame section disclosed in a prior patent application.
Figure 61B:
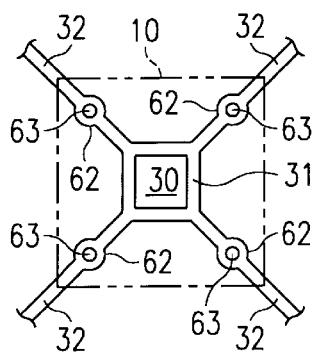
Figure 61C:
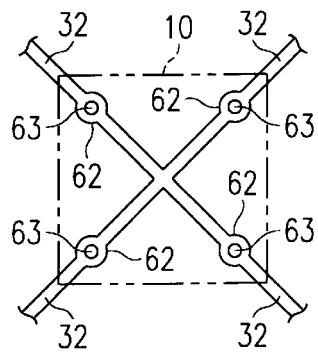

Also, FIG. 37(g) shows an example that is suitable for a package, such as the DIP (dual-in-line package), and the support pins 32 are provided not on a diagonal of the IC chip 10 but on the central axes.

All of the support pins 32 and support pin sections 132 are less than 1.0 mm wide. Also, the number of support pins is not limited to four, and may have 2, 3, 5, or more.

Embodiments of this invention were explained above, but the embodiments can be further altered within the technical scope of this invention.

For example, the patterns of the thermoplastic polyimide and/or the UV curing adhesive are not limited to being in the vertical direction when they are in a striped pattern, they may also be in the horizontal direction or at an angle, and take on various patterns other than the striped or dotted pattern.

Also, in place of the thermoplastic polyimide, other mounting materials can be used, such as the epoxy group resins.

Also, the size, shape, and the like of the mounting pads, support pins, heater inserts and their mounting pad insertion cavities may be changed in various ways. Also, even from the standpoint of materials, the lead frame can be made of various metals, such as 42 alloy, copper alloy, and copper, and the heater insert can be made of stainless steel or the like.

Also, a structure that is the same as the lead frame can be applied to other types of lead frames, for example, to a tape carrier system. The bonding is also not limited to the wire bonding.

This invention can be applied not only to the QFP package wherein the terminals (leads) extend in four directions, but also to a dual-in-line package or the like.

In our invention, the back surface of the semiconductor element (surface to be mounted) is affixed to a mounting section using a thermoplastic resin, the mounting material has, as its main component, a thermoplastic adhesive, and because no steam explosions are generated during heating due to the hygroscopic moisture that occurs where silver paste is used as the mounting material, a package with good reliability wherein the generation of package cracks is eliminated (or markedly reduced) can be obtained.

Also, even if the mounting section for mounting the semiconductor element is made small, and if the thermoplastic adhesive that serves as the mounting material leaks to the back surface of the mounting section, the problems with package cracks as in the case when silver paste is used are not generated, and because of this, volumetric control of the mounting material becomes easy, and measures to prevent leaking to the mounting section become unnecessary.

Also, because the thermoplastic adhesive that serves as the mounting material allows the semiconductor element to be heat-pressure bonded to the mounting section by thermally processing for an extremely short period of time during the mounting of the semiconductor element, the productivity and process control becomes extremely simple compared to mounting curing, such as when silver paste is used.

We claim:

1. A method of making a semiconductor device comprising the steps of:
   providing a dicing tape including a support layer having thereon a first curable adhesive applied to a portion of said tape and second thermoplastic adhesive applied to a remainder of said tape, said first and second adhesives being applied in a regularly recurring pattern;
   attaching a semiconductor wafer to said dicing tape;
   dividing said semiconductor wafer into individual semiconductor chips;
   curing said first adhesive so that it adheres substantially only to said support layer;
   removing said support layer with said first adhesive attached thereto, whereby said second adhesive is attached to said chip;
   mounting said chip onto a mounting pad by means of said second adhesive.

2. The method of claim 1 wherein said first adhesive is cured by exposing it to UV light.

3. The method of claim 2 wherein said first adhesive is cured by being exposed to UV light through the support layer.

4. The method of claim 1 wherein said pattern is alternating stripes of said first and said second adhesive.

5. The method of claim 2 wherein said pattern is alternating stripes of said first and said second adhesive.

6. The method of claim 3 wherein said pattern is alternating stripes of said first and said second adhesive.

7. The method of claim 1 wherein said pattern is a polka dot pattern.

8. The method of claim 2 wherein said pattern is a polka dot pattern.

9. The method of claim 3 wherein said pattern is a polka dot pattern.

10. The method of claim 1 wherein said chip is mounted onto a mounting pad by heat-pressure bonding the chip onto a leadframe mounting section.

11. The method of claim 10 wherein the bonding step, the glass transition temperature of said second adhesive is selected to be higher than the heater temperature.

12. The method of claim 1 wherein said mounting pad is smaller than said chip.

13. The method of claim 1 wherein said mounting pad is a support pin.

* * * * *